(12) United States Patent
Suhara

(10) Patent No.: US 7,587,814 B2
(45) Date of Patent: Sep. 15, 2009

(54) PRINTED-BOARD SUPPORTING APPARATUS

(75) Inventor: Shinsuke Suhara, Kariya (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 213 days.

(21) Appl. No.: 11/587,353

(22) PCT Filed: Apr. 27, 2005

(86) PCT No.: PCT/JP2005/008001

§ 371 (c)(1),
(2), (4) Date: Oct. 24, 2006

(87) PCT Pub. No.: WO2005/107354

PCT Pub. Date: Nov. 10, 2005

(65) Prior Publication Data

US 2007/0218737 A1    Sep. 20, 2007

(30) Foreign Application Priority Data

Apr. 30, 2004    (JP) .............................. 2004-136088

(51) Int. Cl.
  *B23P 19/00* (2006.01)
  *B23P 21/00* (2006.01)
(52) U.S. Cl. .............................. 29/740; 29/719; 29/721; 29/739; 29/741; 29/742; 414/737; 414/752.1; 269/54.3
(58) Field of Classification Search .................. 29/740, 29/739, 832, 831, 846, 74, 719, 721, 741, 29/742; 439/259, 258, 249, 46, 75; 414/783, 414/736, 737, 738, 752.1; 294/64.1; 901/47; 269/53, 54.1, 54.5, 54.3
See application file for complete search history.

(56) References Cited

U.S. PATENT DOCUMENTS

| 5,515,600 | A  | * | 5/1996 | Iwasaki et al. ................ 29/740 |
| 6,264,187 | B1 | * | 7/2001 | Hertz et al. .................. 269/266 |
| 6,435,808 | B1 | * | 8/2002 | Araya et al. ................. 414/783 |
| 6,585,245 | B2 | * | 7/2003 | Isogai et al. .................. 269/21 |
| 2002/0070102 | A1 | * | 6/2002 | Kawada et al. .............. 198/817 |

FOREIGN PATENT DOCUMENTS

JP    A 4-41351    2/1992

(Continued)

*Primary Examiner*—Minh Trinh
*Assistant Examiner*—Tai Nguyen
(74) *Attorney, Agent, or Firm*—Oliff & Berridge, PLC

(57) ABSTRACT

A printed-board supporting apparatus includes a support pin that is attached to a pin-supporting table. An image of the support surface of the support pin is taken by a mark-image taking device, at a first position where a center of an image-take surface of the mark-image taking device is expected to coincide with a center of the support surface of the support pin. Another image of the support surface is taken at a second position where the center of the image-take surface is distant from the center of the support surface by a predetermined distance. At the second position, the image of the support surface is formed on the image-take surface at a position corresponding to the height of the support surface. Based on the position corresponding to the height of the support surface, the height of the support surface relative to the mark-image taking device is obtained.

9 Claims, 10 Drawing Sheets

FOREIGN PATENT DOCUMENTS

| | | |
|---|---|---|
| JP | A 4-372199 | 12/1992 |
| JP | A 06-291490 | 10/1994 |
| JP | B2 2824378 | 9/1998 |
| JP | A 11-195899 | 7/1999 |
| JP | B2 3093339 | 7/2000 |
| JP | A 2002-50899 | 2/2002 |
| JP | A 2002-185189 | 6/2002 |
| JP | 2003-218595 * | 7/2003 |
| JP | A 2003-218595 | 7/2003 |
| JP | A 2003-298294 | 10/2003 |

* cited by examiner

CASE WHERE HEIGHT OF SUPPORT SURFACE 166 OF
SUPPORT PIN 150 HAVING STANDARD LENGTH IS CORRECT

PRINTED-BOARD SUPPORTING APPARATUS

TECHNICAL FIELD

The present invention relates to a printed-board supporting apparatus and particularly to a printed-board supporting apparatus including at least one support pin having a support surface that supports, at a height thereof, a printed board.

BACKGROUND ART

The above-indicated sort of printed-board supporting apparatus is well known in the art, and is disclosed by, e.g., the below-identified Patent Document 1 or Patent Document 2. Patent Document 1 discloses a printed-board supporting apparatus employing a plurality of support pins each of which has a reference mark provided on a support surface thereof to support a printed board; a pin supporting table that supports the support pins attached thereto; and an image taking device that takes an image of the reference mark of the each support pin. Based on image data representing the taken image, a position or positions of the each support pin in a horizontal direction or directions is or are calculated, and a positional error or errors of the each support pin is or are calculated. If the positional error or errors goes or go beyond a permission range or ranges, the positioning of the each support pin is judged as being inappropriate, and then is corrected. The printed-board supporting apparatus employing the support pins is mainly used in the case where it is needed to support locally a printed board without interfering with one or more electronic circuit components already mounted on the reverse surface of the board and/or irregularities present on the reverse surface. Therefore, if the positioning of each support pin is inappropriate, the electronic circuit component(s), the printed board, and/or the support pin(s) may be damaged or even broken. Thus, it is needed to position accurately each support pin on the pin supporting table.

In addition, Patent Document 2 discloses a printed-board supporting apparatus employing a plurality of support pins; a pin supporting table that supports the support pins attached thereto to support a printed board; an image taking device that takes an image of the printed board supported by the support pins; and a monitor that displays the taken image of the printed board so that an operator can manually adjust a height of the printed board while observing the image displayed on the monitor. For example, in the case where the current sort of printed boards are changed to a new sort of printed boards each having a different thickness, respective heights of respective support surfaces of the support pins are adjusted according to a height of the reverse surface of the new sort of printed board that is to be supported by the support pins.

Patent Document 1: Japanese Patent Application Publication No. 11-195899

Patent Document 2: Japanese Patent Application Publication No. 2002-185189

DISCLOSURE OF THE INVENTION

Problem Solved by the Invention

Although the printed-board supporting apparatus disclosed by Patent Document 1 can correct the error of positioning of each support pin, an error of the height of the support surface of each support pin cannot be corrected. In addition, although the printed-board supporting apparatus disclosed by Patent Document 2 enables the operator to adjust manually the height of the support surface of each support pin, it is considerably cumbersome for the operator to carry out the manual adjusting operation.

It is therefore an object of the present invention to provide a printed-board supporting apparatus that employs one or more support pins to support a printed board and that can easily treat the height of the support surface of the or each support pin.

Solution to the Problem

The above object has been achieved by the present invention, which provides a printed-board supporting apparatus, comprising at least one support pin having a support surface adapted to support a printed board; a pin supporting member which supports the at least one support pin; and a height detecting device which includes at least a height detecting head and detects a height of the support surface of the at least one support pin supported by the pin supporting member.

The height of the support surface of the support pin may be detected by using, as a reference height, a height of the height detecting head or the pin supporting member, or a height pre-determined for the present printed-board supporting apparatus. In each case, the height detecting device may include a height-direction-distance detecting portion that detects, as a height-direction distance, a distance of the support surface from the reference height in a height direction, or a height-error detecting portion that detects an error of an actual height of the support surface from a nominal height thereof. Here, the detection of the height of the support surface encompasses the detection of the height-direction distance and the detection of the height error. In the following description, therefore, the phrase "the detection of the height of the support surface" or "detect(s) the height of the support surface" is defined as meaning both the detection of the height-direction distance and the detection of the height error.

The height detecting head may be any of various known height detecting heads such as a non-contact-type head (e.g., a laser displacement pickup or an image taking device) or a contact-type head (e.g., a head including a contact or pressure sensor and an elevating and lowering device that elevates and lowers the sensor). The laser displacement pickup includes, e.g., a laser-beam generator that generates a laser beam; an emission optical system that converges the laser beam on the support surface of the support pin; a reception optical system that converges the reflected beam or light on a matrix of position-sensing semiconductor elements; and a calculating circuit that calculates a position where the reflected light is converged. Since the position where the reflected light is converged on the matrix of position-sensing semiconductor elements changes depending upon the height of the support surface, the height of the support surface can be obtained from the calculated position.

The phrase "printed board" means or encompasses a printed wiring board on which an electric wiring has been formed by printing; a printed circuit board as an end product in which electronic circuit components have been mounted at predetermined positions on, and bonded by soldering to, a printed wiring board; and all intermediate products between the printed wiring board and the printed circuit board.

ADVANTAGES OF THE INVENTION

If the height of the support surface of the support pin is detected, then it may be judged whether the detected height is appropriate for supporting the printed board. The height of the support surface may be made inappropriate by various causes such as a cause that an incorrect sort of support pin (e.g., having an incorrect length) has been selected; a cause that the height of the support surface has been erroneously adjusted; a cause that the support surface has been worn; a cause that a foreign matter is bitten by, and between, the support pin and the pin supporting member; or a cause that the pin supporting member has one or more depressed portions. If the height of the support surface is obtained, then it can be judged whether the height of the support pin is appropriate. If the cause for the problem is removed, the height of the support surface of the support pin can be made appropriate in the printed-board supporting apparatus. Hereinafter, errors of the height of the support surface that are caused by the selection of incorrect sort of support pin(s) will be referred to as the "incorrect-sort-caused errors"; errors of the height of the support surface that are caused by the erroneous adjustment of the height will be referred to as the "erroneous-adjustment-caused errors"; and considerably small errors of the height of the support surface that are caused by the wearing of the support pin(s), the biting of foreign matter, and/or the depression of the pin supporting member will be all referred to as the "wearing-caused errors". The errors of the height of the support surface encompass all those sorts of errors.

In addition, if the height of the support surface is detected, then the sort of the support pin actually supported by the pin supporting member, the degree of wearing of the support pin, and/or the defect of the support surface can be identified. That is, an inappropriate support pin such as a pin whose support surface is worn or has a defect, can be recognized. In this case, the height detecting device constitutes a portion of an inappropriate-support-pin recognizing device.

In addition, if the error of height of the support surface is obtained, then the height of the support surface can be adjusted. For example, in the case where the support pin includes an attachment portion that is adapted to be attached to the pin supporting member, and a support portion that has the support surface and is movable relative to the attachment portion in a direction parallel to the axis line of the support pin, and the printed-board supporting apparatus employs a moving device that moves the support portion relative to the attachment portion, the moving device can be operated, based on the obtained height error, to move the support portion and thereby adjust the height of the support surface. In a particular case where the moving device can be automatically controlled, the height of the support surface can be automatically adjusted. In the last case, the height detecting device cooperates with the moving device to constitute a support-pin-height adjusting device.

MODES OF THE INVENTION

Hereinafter, some examples of various modes of the present invention that are recognized as being claimable in the present application (hereinafter, referred to as the claimable modes, where appropriate) will be described and explained. The claimable modes include at least respective modes corresponding to the appended claims, but may additionally include broader or narrower modes of the present invention or even one or more different inventions than the claimed inventions. Each of the following modes (1) through (10) is numbered like the appended claims, and depends from the other mode or modes, where appropriate, so as to help understand the claimable modes and to indicate and clarify possible combinations of the elements or technical features thereof. It is, however, to be understood that the present invention is not limited to the elements or technical features of the following modes, or the combinations thereof, that will be described below for illustrative purposes only. It is to be further understood that each of the following modes should be construed in view of not only the explanations directly associated therewith but also the detailed description of the best modes of the invention, and that in additional claimable modes, one or more elements or one or more technical features may be added to, or deleted from, any of the following specific modes.

(1) A printed-board supporting apparatus, comprising at least one support pin having a support surface adapted to support a printed board; a pin supporting member which supports the at least one support pin; and a height detecting device which includes at least a height detecting head and detects a height of the support surface of the at least one support pin supported by the pin supporting member.

(2) The printed-board supporting apparatus according to the mode (1), further comprising a first relatively moving device which moves at least one of (a) the height detecting head and (b) the at least one support pin relative to an other of (a) the height detecting head and (b) the at least one support pin, in a direction perpendicular to an axis line of the at least one support pin.

The printed-board supporting apparatus in accordance with this mode can automatically detect the height of the support surface of the support pin quickly and easily.

(3) The printed-board supporting apparatus according to the mode (1) or the mode (2), wherein the height detecting head comprises an image taking device which has an image-take surface and which takes, in a direction facing the support surface of the at least one support pin, an image of the at least one support pin, at a position where an image-take center as a center of the image-take surface is offset from a center of the support surface.

The image taking device may be a surface-image taking device that can take a two-dimensional image at once, or a line-image sensor that has an array of image taking elements. When the line sensor iteratively takes a "line" or linear image while one of the line sensor and the support surface is moved relative to the other in a direction perpendicular to the array of image taking elements, a two-dimensional image of the support surface can be taken.

If the image of the support surface is taken in the state in which the image-take center is accurately aligned with the center of the support surface, the image of the support surface is formed on the image-take surface such that the center of the support surface coincides with the image-take center, even if the height of the support surface may have some error. On the other hand, if the image of the support surface is taken in the state in which the image-take center is offset from the center of the support surface, the image of the support surface is formed on the image-take surface such that the center of the support surface is distant from the image-take center by different distances corresponding to different heights of the support surface. Therefore, a height of the support surface can be obtained based on a position of the image of the same.

The image taking device in accordance with this mode enjoys such an advantage that an amount of image data representing only the image of the support surface is considerably small and accordingly can be easily processed. Thus, the height of the support surface can be quickly and easily detected. However, the image taking device may be one that takes an image of the support portion of the support pin that has at least the support surface, in a direction perpendicular to the axis line of the support pin; or one that takes an image of the support portion, in an oblique direction intersecting the axis line of the support pin.

(4) The printed-board supporting apparatus according to the mode (3), wherein the image taking device comprises a mark-image taking device adapted to take an image of at least one fiducial mark provided on the printed board.

In this mode, the mark-image taking device also functions as the image taking device that takes the image of the support surface of the support pin. Thus, the preset printed-board-supporting apparatus can be produced at reduced cost.

(5) The printed-board supporting apparatus according to the mode (3) or the mode (4), further comprising a first relatively moving device which moves at least one of (a) the image taking device and (b) the at least one support pin relative to an other of (a) the image taking device and (b) the at least one support pin, in at least a direction perpendicular to an axis line of the at least one support pin, wherein the height detecting device further comprises an image-taking control portion which controls the image taking device and the first relatively moving device, such that the image taking device takes a first image of the at least one support pin at a first image-take position where the image-take center is aligned with the center of the support surface, and takes a second image of the at least one support pin at a second image-take position distant from the first image-take position by a predetermined distance in the direction perpendicular to the axis line of the at least one support pin; a perpendicular-direction-position detecting portion which detects, based on first image data representing the first image taken by the image taking device, a position of the at least one support pin in the direction perpendicular to the axis line thereof; and a height detecting portion which detects, based on the detected position of the at least one support pin in the direction perpendicular to the axis line thereof and second image data representing the second image taken by the image taking device, the height of the support surface of the at least one support pin.

It is preferred that the second image-take position be distant from the first image-take position by the predetermined distance assuring that an image of the entirety of the support surface is formed on the image-take surface, irrespective of the size, shape and/or height of the support surface. If the position of the support pin in the direction perpendicular to the axis line thereof is detected, then a positional error of the support pin can be obtained. Thus, when the second image of the support surface is taken at the second image-take position, the height of the support pin can be detected while influences from the positional error of the support pin in the perpendicular direction are removed. For example, if the first relatively moving device is controlled based on the positional error of the support pin in the perpendicular direction, then the second image of the support surface can be taken at the second image-take position freed of the influences from the positional error. Alternatively, the second image data representing the second image of the support surface taken at the second image-take position, can be processed to detect the height of the support surface, while the influences from the positional error are removed.

In a particular case where it is assured that the image-take center is aligned with the center of the support surface, it is not needed to take the first image of the support surface at the first image-take position. That is, the height of the support surface can be detected based on only the second image of the support surface taken at the second image-take position.

(6) The printed-board supporting apparatus according to any of the modes (1) through (5), further comprising a judging portion which judges, based on the height of the support surface detected by the height detecting device, whether the at least one support pin is appropriate.

If the height of the support surface is detected, then it can be judged whether the support pin is appropriate, based on an amount of error of the detected height. Thus, the printed-board supporting apparatus in accordance with this mode can automatically judge or check whether the height of the support surface is appropriate. Therefore, in the case where the present printed-board supporting apparatus is employed by an operation performing system such as an electronic-circuit-component mounting system, the present apparatus can automatically check whether the height of the support surface is appropriate, before the system starts an operation.

As explained previously, there are various causes that make the height of the support pin inappropriate. However, once the support pin is judged as being inappropriate, then the cause for the judgment can be removed, so that the inappropriate support pin may not be used to support the printed board. For example, the support pin whose support surface is judged as excessively high can be prevented from interfering with the printed board or one or more components already mounted on the reverse surface of the printed board, so that the printed board, the component(s) and/or the support pin may not be damaged; and the support pin whose support surface is judged as excessively low can be prevented from failing to support the printed board because the height of the support surface is short.

(7) The printed-board supporting apparatus according to the mode (6), further comprising a treating portion which carries out a predetermined treating operation when the judging portion judges that the at least one support pin is not appropriate.

The treating portion may be an informing control portion, a support-pin-exchanging control portion, or a carrying-in-inhibiting control portion that inhibits carrying-in of the printed board to, e.g., an operation performing system employing the present printed-board supporting apparatus.

If the treating portion is used, then the cause that makes the support pin inappropriate can be automatically removed, or can be manually removed by an operator. Alternatively, one or more operations related to the printed-board supporting function of the printed-board supporting apparatus can be appropriately treated based on the cause. Thus, the printed-board supporting apparatus including the appropriate support pin or pins can be quickly set, and a machine or system employing the printed-board supporting apparatus can be freed of one or more drawbacks caused by the inappropriate pin or pins.

(8) The printed-board supporting apparatus according to the mode (7), further comprising an informing device, wherein the treating portion comprises an informing control portion which controls, when the judging portion judges that the height of the support surface of the at least one support pin is not appropriate, the informing device to inform a person of a judgment that the at least one support pin is not appropriate.

The informing device may be any of various sorts of informing devices that can cause an operator to perceive the judgment through an informing medium such as image (e.g., character, numeral, symbol, or figure), sound, voice, or light. For example, the informing device may be a display device having a display screen; a speaker; a buzzer; a lighting device (e.g., a lamp); or a flickering device. Based on the operation of the informing device, an operator can seek the cause that makes the height of the support pin inappropriate, remove the cause, or command another operator to do it.

(9) The printed-board supporting apparatus according to any of the modes (1) through (8), further comprising a support-pin storing device which stores a plurality of support pins; a support-pin holding device which holds, and releases, each of the support pins; a second relatively moving device which moves at least one of (a) the support-pin holding device and (b) a combination of the pin supporting member and the support-pin storing device relative to an other of (a) the support-pin holding device and (b) the combination; and a support-pin-changing control device which controls the support-pin holding device and the second relatively moving device such that the support-pin holding device takes the each support pin from the support-pin storing device and mounts the each support pin on the pin supporting member, and takes the each support pin from the pin supporting member and stores the each support pin in the support-pin storing device.

The printed-board supporting apparatus in accordance with the this mode can automatically re-set the support pin or pins, e.g., can automatically remove, or move, the current support pin or pins from, or on, the pin supporting member, and/or mount a new support pin or pins on the pin supporting member, and can automatically detect the height of the support pin or pins that have been moved, or mounted, on the pin supporting member.

(10) The printed-board supporting apparatus according to the mode (9), further comprising a judging portion which judges, based on the height of the support surface detected by the height detecting device, whether the each support pin mounted on the pin supporting member is appropriate; and a treating portion which carries out a predetermined treating operation when the judging portion judges that the each support pin is not appropriate, wherein the treating portion comprises a support-pin-exchanging control portion which controls the support-pin holding device and the second relatively moving device such that the support-pin holding device exchanges the each support pin judged as being not appropriate, with an appropriate one of the support pins stored by the support-pin storing device.

In some cases, different sorts of support pins having different lengths are used together to support a single printed board. If a cause that makes a height of one support pin inappropriate is estimated to be use of an incorrect sort of support pin, the inappropriate support pin, i.e., the incorrect sort of support pin can be automatically exchanged with an appropriate sort of support pin, and the appropriate sort of support pin can be quickly mounted on the pin supporting member.

If the cause that makes the height of one support pin inappropriate cannot be estimated, or if the cause is estimated to be different from the use of incorrect sort of support pin, for example, the biting of foreign matter, the second relatively moving device can be used to remove quickly the inappropriate support pin from the pin supporting member, so as to store automatically the inappropriate support pin in, e.g., a support-pin storing portion independent of the above-indicated support-pin storing device, or withdraw the inappropriate support pin to a support-pin withdrawal portion.

EXPLANATION OF REFERENCE NUMERALS

BEST MODE FOR CARRYING OUT THE INVENTION

Hereinafter, there will be described in detail embodiments of the present invention, by reference to the drawings. It is, however, to be understood that the present invention is by no means limited to the details of those embodiments but may be embodied with various changes and improvements, such as those described in DISCLOSURE OF THE INVENTION, that may occur to a person skilled in the art.

Figure 1:
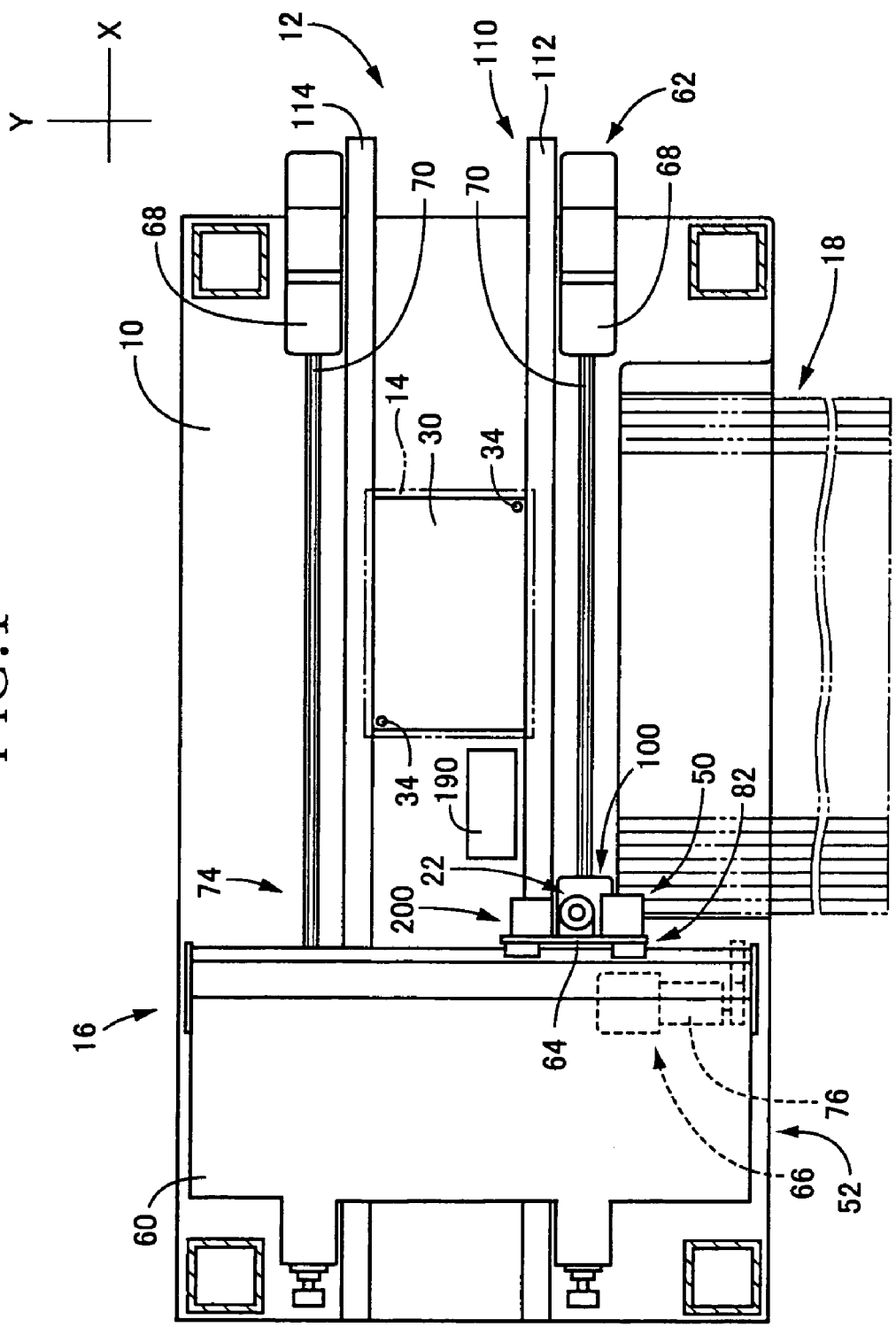
FIG. 1 is a plan view showing an electronic-circuit-component mounting system including a printed-board supporting apparatus to which the present invention is applied.

FIG. 1 shows an electronic-circuit-component mounting system including a printed-board supporting apparatus 14 to which the present invention is applied. The present mounting system includes a mounting head 50 that can be moved to an arbitrary position on a plane parallel to an upper surface of a printed board 30, receives electronic circuit components 94 from a component supplying device 18, and mounts the components 94 on the printed board 30. Since a basic construction of this mounting system is known from, e.g., Japanese Patent No. 2,824,378, it will be described below, just briefly.

As shown in FIG. 1, the electronic-circuit-component mounting system includes a bed 10 as a base member; a printed-board conveying device 12; the printed-board supporting apparatus 14; a component mounting device 16; the component supplying device 18; a mark-image taking unit 22; and a control device 24 (FIG. 5) that controls those devices 12, 14, 16, 18, 22 all of which are provided on the bed 10. In FIG. 1, reference numeral 30 designates a printed board that has, on a component-mount surface thereof, a plurality of (e.g., two) fiducial marks 34.

Figure 2:
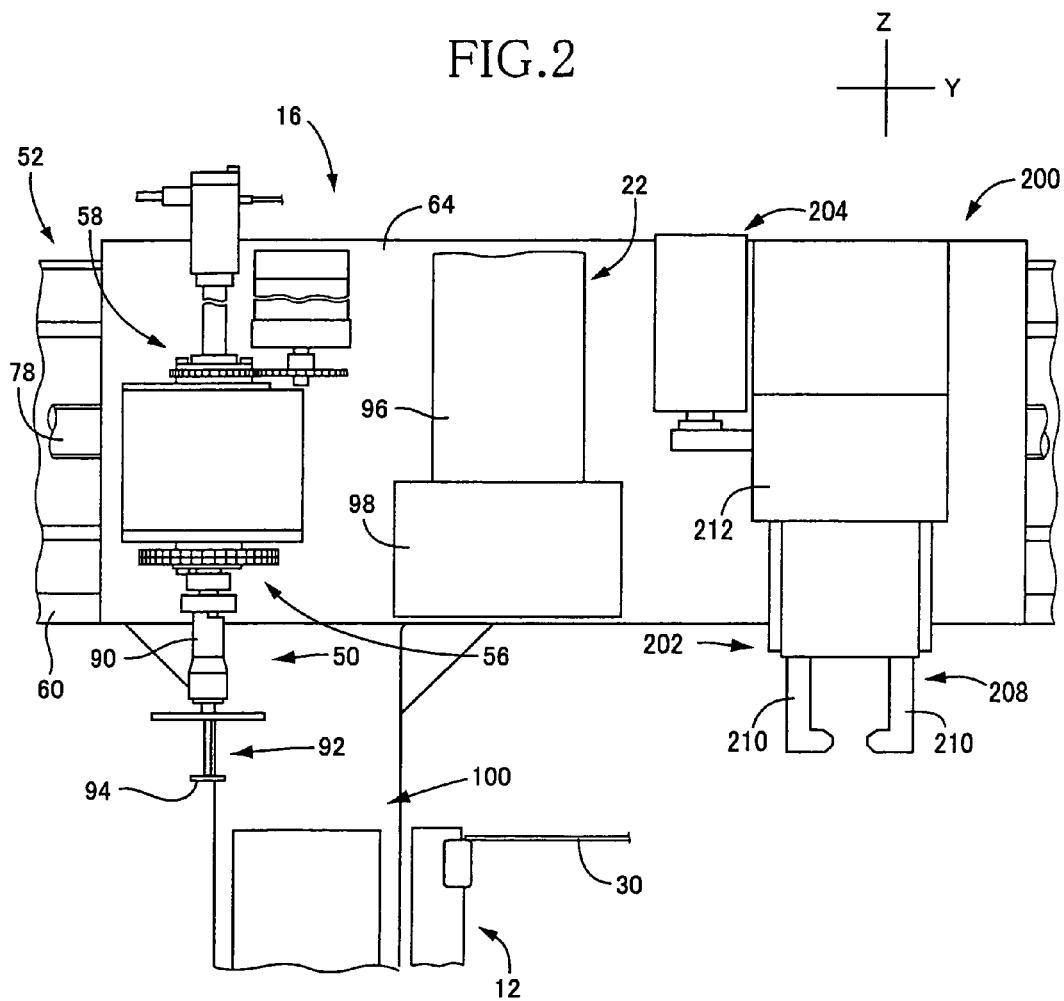
FIG. 2 is a side view showing a mounting head, a mark-image taking device, and a pin holding unit of the mounting system.

As shown in FIG. 1, the component supplying device 18 is provided as a stationary element at a fixed position on one side of the printed-board conveying device 12. Since the component supplying device 18 is not relevant to the present invention, it is not illustrated or described in detail. As shown in FIGS. 1 and 2, the component mounting device 16 essentially includes the mounting head 50 as a sort of operation performing head; an X-Y robot 52 as an operation-performing-head moving device or a component-holder moving device that moves the mounting head 50 to an arbitrary position on a horizontal plane as the plane parallel to the component-mount surface of the printed board 30; a head rotating device 56 that rotates the mounting head 50 about a vertical axis line; and a head elevating and lowering device 58 that elevates and lowers the mounting head 50.

As shown in FIG. 1, the X-Y robot 52 includes an X-axis slide 60 as a first movable member; an X-axis-slide moving device 62; a Y-axis slide 64 as a second movable member; and a Y-axis-slide moving device 66. The X-axis-slide moving device 62 includes two X-axis-slide driving motors 68; two ball screws 70 each as a sort of feed screw; and two nuts (not shown), and moves the X-axis slide 60 in an X-axis direction. The X-axis-slide moving device 62 cooperates with the X-axis slide 60 to constitute an X-axis moving device 74. The Y-axis-slide moving device 66 includes a Y-axis-slide driving motor 76; a ball screw 78; and a nut (not shown), and moves the Y-axis slide 64 in a Y-axis direction. The Y-axis-slide moving device 66 cooperates with the Y-axis slide 64 to constitute a Y-axis moving device 82. In the present embodiment, the X-axis direction is a horizontal direction, and the Y-axis direction is another horizontal direction perpendicular to the X-axis direction on the horizontal plane.

As shown in FIG. 2, the mounting head 50 includes a nozzle holder 90 as a component-holder holder that holds a suction nozzle 92 as a component holder such that the suction nozzle 92 is detachable from the nozzle holder 90. When the mounting head 50 is moved in the X-axis and Y-axis directions by the X-Y robot 52, to the arbitrary position on the horizontal plane, the nozzle holder 90 is moved, relative to the component supplying device 18 and the printed board 30, so that the suction nozzle 92 takes an electronic circuit component (hereinafter, simply referred to as the "component") 94 from the supplying device 18 and mounts the component 94 on the printed board 30. Since the mounting head 50, the head rotating device 56, and the head elevating and lowering device 58, each employed in the present embodiment, have the same constructions as those of the mounting head, the head rotating device, and the head elevating and lowering device disclosed by Japanese Patent No. 3,093,339, no detailed description thereof is provided.

As shown in FIG. 2, the Y-axis slide 64 carries, in addition to the mounting head 50, the mark-image taking unit 22. The mark-image taking unit 22 includes a mark-image taking device 96 as a sort of recognizing device; and a lighting device 98. The mark-image taking unit 22 is moved with the mounting head 50 by the X-Y robot 52, to the arbitrary position on the horizontal plane, so as to take respective images of the fiducial marks 34. In the present embodiment, the mark-image taking device 96 is a surface-image taking device that momentarily takes a two-dimensional image of an object. The mark-image taking device 96 is constituted by, e.g., a CCD (charge coupled device) camera, and can take, in addition to the images of the fiducial marks 34, respective images of the printed board 30 and support pins 150, described later. Meanwhile, as shown in FIG. 1, the X-axis slide 60 carries a component-image taking unit 100. The component-image taking unit 100 includes a component-image taking device 102 (FIG. 5) that takes an image of the component 94 held by the suction nozzle 92. Based on the taken images of the fiducial marks 34, respective positional errors of each of a plurality of component-mount points predetermined on the component-mount surface of the printed board 30, with respect to the X-axis and Y-axis directions, are calculated by the control device 24; and when the components 94 are mounted at the respective component-mount points on the printed board 30, the positional errors of each component-mount point are corrected together with respective positional errors of each component 94 held by the suction nozzle 92 with respect to the X-axis and Y-axis directions that are calculated based on the taken image of the each component 94.

Figure 3:
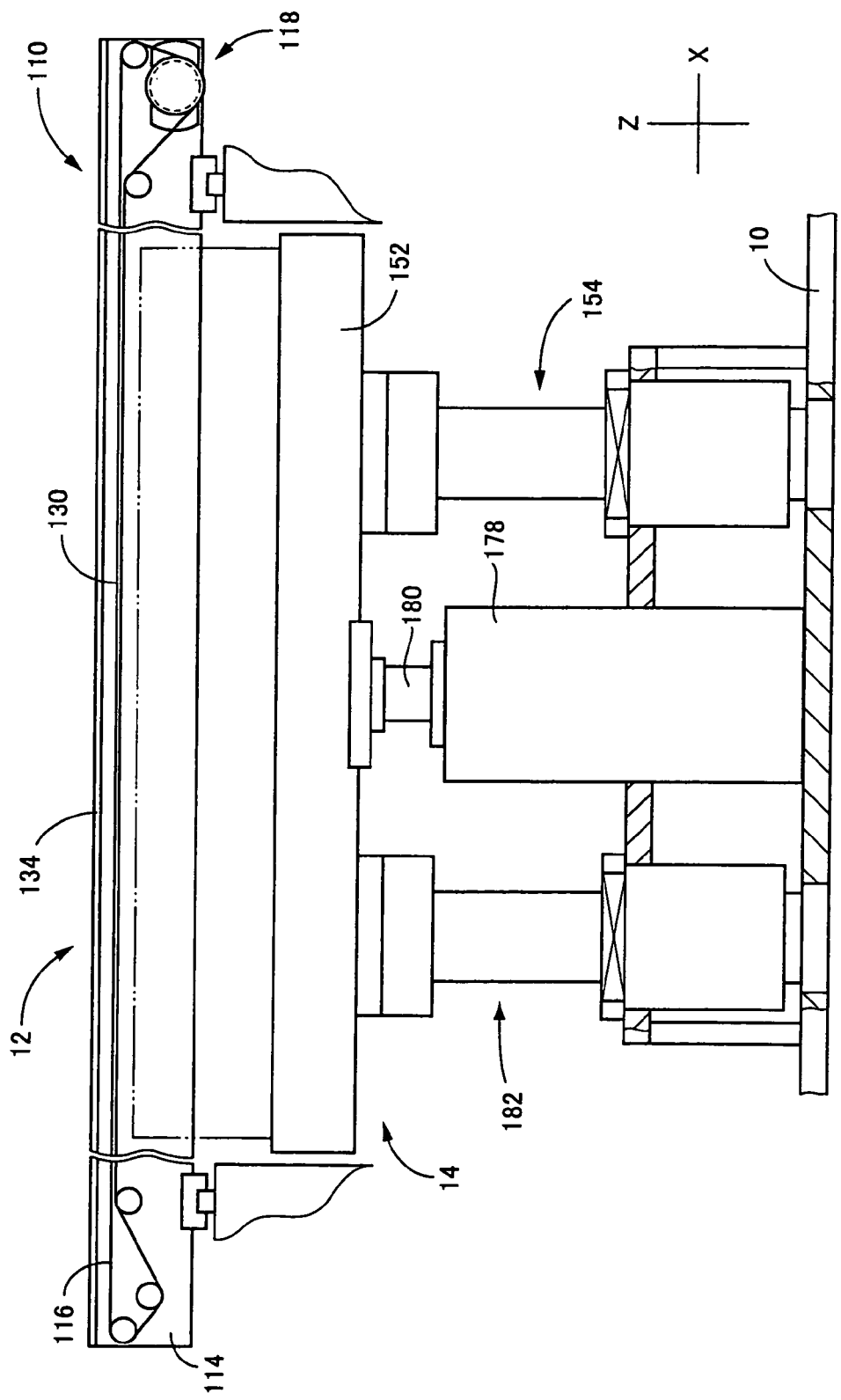
FIG. 3 is a front view showing the printed-board supporting apparatus and a board conveying device of the mounting system.

As shown in FIG. 3, the printed-board conveying device 12 includes a belt conveyor 110. The belt conveyor 110 includes a pair of guide rails (i.e., a pair of side frames) 112, 114 (FIG. 1) each as a main frame; a pair of conveyor belts 116 (one belt 116 is shown in FIG. 3) as a pair of endless conveying members; and a circulating device 118 (FIG. 3) that drives or circulates the conveyor belts 116. One of the two guide rails 112, 114 is a stationary rail, and the other guide rail is a movable rail that is movable relative to the one rail. When the movable rail is moved, by a rail moving device (not shown), toward, and away from, the stationary rail, a board-convey width corresponding to a width of each printed board 30 is automatically changed or adjusted.

The two conveyor belts 116 are supported by the two guide rails 112, 114, such that the belts 116 are circulateable, and are circulated by the circulating device 118 so that the printed board 30 placed on respective upper surfaces of the two belts 116 is conveyed in the X-axis direction while being guided by the two rails 112, 114. A horizontal plane containing the respective upper surfaces of the two conveyor belts 116 provides a board-convey plane 130. The two guide rails 112, 114 include respective hold-down portions 134 (the hold-down portion 134 of the guide rail 114 is shown in FIG. 3), and are provided with respective clamping members (not shown) that cooperate with each other to push the printed board 30 upward from the board-convey plane 130 and cooperate with the respective hold-down portions 134 to sandwich and clamp the printed board 30. The two hold-down portions 134 and the two clamping members cooperate with each other to constitute a printed-board clamping device.

Figure 4:
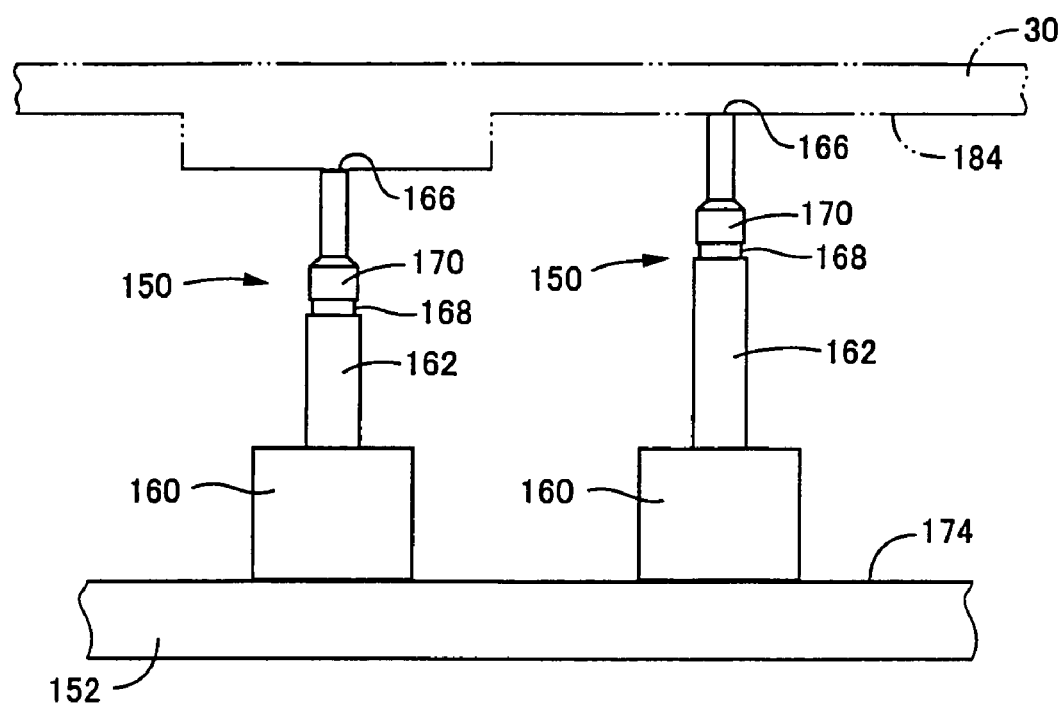
FIG. 4 is a front view showing a plurality of support pins and a pin supporting table of the printed-board supporting apparatus.

Next, the printed-board supporting apparatus 14 will be described by reference to FIGS. 3 and 4. The supporting apparatus 14 includes one or more support pins 150; a pin supporting table 152 as a pin supporting member; and a support-pin elevating and lowering device 154, and is provided at a fixed position midway on a path along which the printed board 30 is conveyed by the printed-board conveying device 12. As schematically shown in FIG. 4, each of the support pins 150 includes a seat portion 160 as an attachment portion or a base portion thereof; and a pin portion 162 as a support portion thereof, and is detachably attached, by a magnetic force, to the pin supporting table 152. To this end, the seat portion 160 incorporates a permanent magnet (not shown). The pin portion 162 projects perpendicularly from the seat portion 160, and is detachably attached, by, e.g., screwing, to the same 160. A free or upper end surface of the pin portion 162 provides a support surface 166 to support a lower or reverse surface of the printed board 30. A length of each support pin 150, i.e., a height of the support surface 166 relative to the pin supporting table 152 can be adjusted by adjusting an amount of screwing of the pin portion 162 relative to the seat portion 160. The pin portion 162 has an annular groove 168 open in an outer circumferential surface thereof, and an annular engaging portion 170. In the present embodiment, it is assumed that adjustment of the height of the support surface 166 is carried out, e.g., when the support surface 166 is worn, and accordingly an amount of adjustment of the height is considerably small. An upper surface of the pin supporting table 152 provides a pin-attachment surface 174 to which the support pins 150 are attached, and at least the pin-attachment surface 174 is formed of a magnetic material such as a steel. Thus, each support pin 150 can be detachably attached, by the magnetic force, to an arbitrary position on the pin-attachment surface 174, so that the each support pin 150 is supported by the pin supporting table 152. In the present embodiment, the permanent magnet incorporated by the seat portion 160 and the magnetic-material-based pin-attachment surface 174 as a pin-support surface cooperate with each other to constitute a support-pin attaching or fixing device.

As shown in FIG. 3, the support-pin elevating and lowering device 154 includes, as a drive source thereof, an air-cylinder device 178 as a sort of fluid-pressure-operated cylinder device as a sort of fluid-pressure-operated actuator. When a piston rod 180 of the air-cylinder device 178 is extended or retracted, the pin supporting table 152 is elevated or lowered while being guided by a guide device 182, i.e., elevated to a pre-determined upper end position thereof and lowered to a pre-determined lower end portion thereof, so that the support pins 150 are moved toward, and away from, the printed board 30. Thus, the support-pin elevating and lowering device 154 also functions as a pin-supporting-member elevating and lowering device, and as a moving device that moves at least one of (a) the support pins 150 and (b) the printed board 30 toward, and away from, the other of (a) the support pins 150 and (b) the printed board 30. The lower end position is pre-determined such that the support pins 150 attached to the pin supporting table 152 do not interfere with the printed board 30 conveyed by the printed-board conveying device 12 or the components 94 already mounted on the reverse surface of the board 30; and the upper end position, shown in FIG. 4, is pre-determined such that the support pins 150 engage, and thereby support, a supported surface 184 as the lower or reverse surface of the printed board 30. Thus, the upper end position can also be said as a board-support position. For example, the upper end position is defined by a stopper (not shown) that stops the upward movement of the pin supporting table 152. In the present embodiment, the upper end position is not changed even if the current sort of printed boards 30 may be changed to a new sort of printed boards 30 each having a different thickness from that of the current sort of boards 30. The above-described clamping members are commonly used for the different sorts of printed boards 30, such that during the upward movement of the pin supporting table 152, the clamping members are engaged with the table 152 and accordingly are moved upward together with the same 152. After the clamping members cooperate with the hold-down portions 134 to sandwich the printed board 30, the pin supporting table 152 is further moved upward relative to the clamping members, so that the table 152 can reach the upper end position.

As shown in FIG. 1, a support-pin storing device 190 is provided at a position adjacent to the printed-board supporting apparatus 14. The support-pin storing device 190 has a plurality of pin accommodating portions (not shown) that accommodate a plurality of support pins 150, respectively, such that each of the support pins 150 is positioned relative to the storing device 190. Each of the pin accommodating portions of the support-pin storing device 190 has a pin-placement surface on which a support pin 150 is placed, at a height corresponding to the pin-attachment surface 174 of the pin supporting table 152 in the state in which the table 152 is positioned at the lower end position.

In the present embodiment, each support pin 150 can be automatically attached to, and detached from, the pin supporting table 152, by utilizing the X-Y robot 52 of the component mounting device 16. To this end, the Y-axis slide 64 carries a pin holding unit 200. The pin holding unit 200 includes a holding head 202 as a support-pin holding device; and a holding-head elevating and lowering device 204 that elevates and lowers the holding head 202. The holding head 202 includes a pin holder 208 as a support-pin holder; and a gripping-jaw driving device 212 that opens and closes a pair of pin gripping jaws 210 as a pair of pin holding members that cooperate with each other to constitute the pin holder 208. The holding head 202 is moved, by the X-Y robot 52, to an arbitrary position on a horizontal plane parallel to the pin-attachment surface 174 of the pin supporting table 152, and is moved, by the holding-head elevating and lowering device 204, to an arbitrary position in directions perpendicular to the pin-attachment surface 174, toward, and away from, the same 174. For example, the holding head 202 is moved downward to a support-pin holding and releasing position where the pair of pin grasping jaws 210 are opened and closed by the gripping-jaw driving device 212 to engage the engaging portion 170 of each support pin 150 and thereby hold the support pin 150, or release the same 150. Since, however, the holding head 202 and the holding-head elevating and lowering device 204 have the same constructions as those of the holding head and the holding-head elevating and lowering device each disclosed by Japanese Patent Application Publication No. 2002-50899, no further description thereof is provided.

Figure 5:
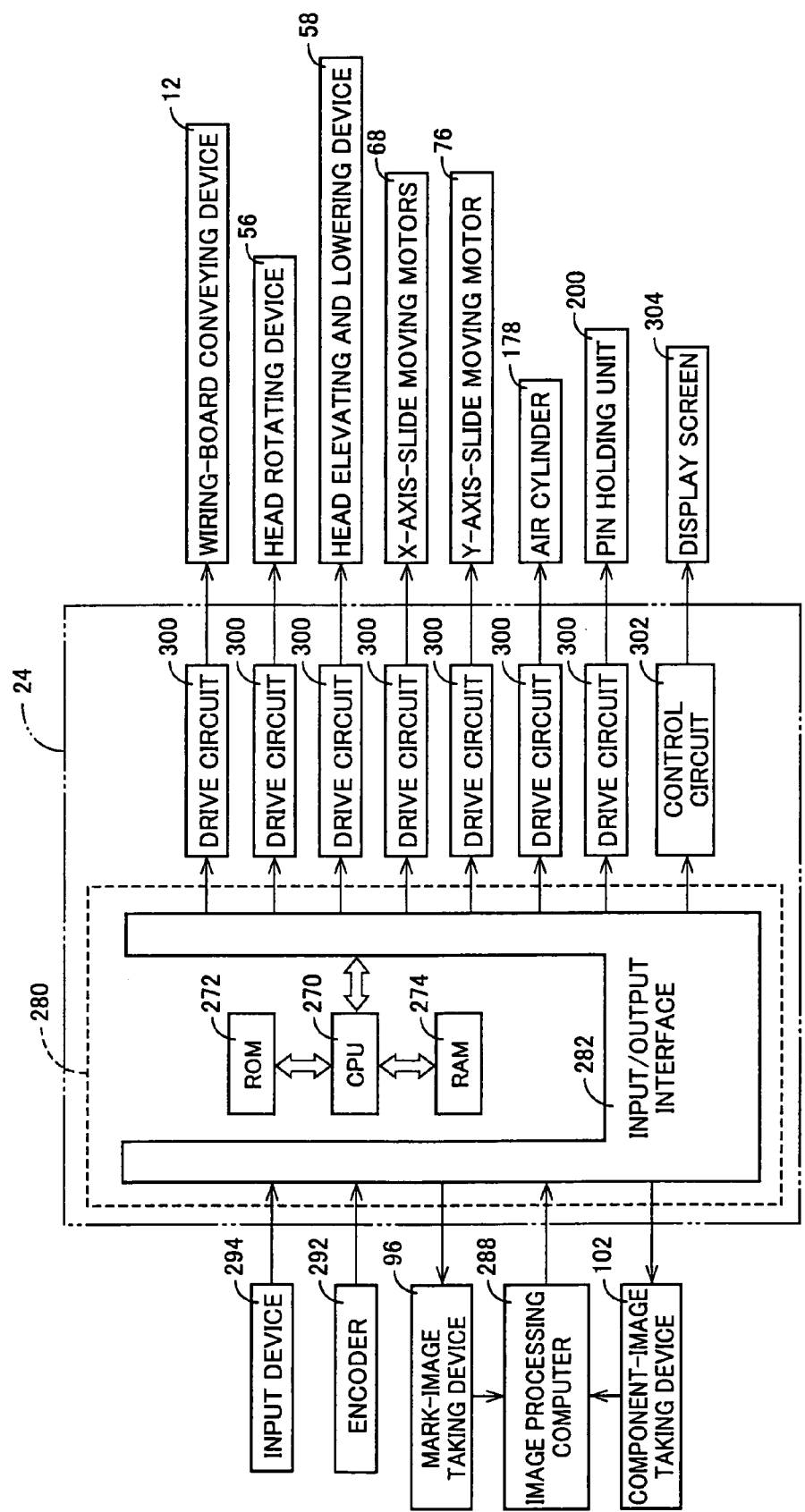
FIG. 5 is a diagrammatic view showing a control device of the mounting system.

As shown in FIG. 5, the control device 24 is essentially constituted by a mounting-control computer 280 including a CPU 270, a ROM 272, a RAM 274, and a bus for connecting those elements 270, 272, 274 to each other. The bus is connected to an input-and-output interface 282 to which the. mark-image taking device 96 of the mark-image taking unit 22, the component-image taking device 102 of the component-image taking unit 100, an image processing computer 288 that processes image data representing the images taken by the mark-image taking device 96 and the component-image taking device 102, an input device 294, and various sensors such as an encoder 292 are connected.

In addition, to the input-and-output interface 282, various actuators such as the drive source of the printed-board conveying device 12 are connected via respective drive circuits 300, and a display screen 304 is connected via a control circuit 302. An electric motor constituting the drive source of, e.g., the printed-board conveying device 12 is a sort of actuator. In the present embodiment, many actuators are each constituted by a servo-motor that is a sort of electric rotary motor and that can be accurately controllable with respect to rotation amount or angle. The servo motors may be replaced with stepper motors. Respective rotation angles of the servo motors are detected by respective encoders each as a rotation-angle detector, and each of those motors is controlled based on a corresponding one of the detected rotation angles. FIG. 5 shows a representative one 292 of those encoders.

The ROM 272 and the RAM 274 store various programs and data, for example, (a) a basic operating program for the present electronic-circuit-component mounting system; (b) a program for carrying out a component mounting operation corresponding to the printed board 30 as an object (hereinafter, simply referred to as the component mounting program); (c) a program for automatically re-setting the printed-board supporting apparatus 14; and (d) a program for checking a height of a support surface 166 of each support pin 150.

When the components 94 are mounted on the printed board 30, first, the board 30 is conveyed by the belt conveyor 110, and is stopped at a pre-determined operation position. When the printed board 30 is carried in, the pin supporting table 152 is positioned at the lower end position; and after the board 30 is carried in, and is stopped at the operation position, the pin supporting table 152 is moved upward to the upper end position. When the printed-board clamping device (not shown) clamps the printed board 30, the support pins 150 cooperate with each other to support the board 30.

A height of the component-mount surface of each printed board 30 when the components 94 are mounted on the surface, is defined by the hold-down portions 134, for all the sorts of printed boards 30 or all the thickness values of the same 30. On the other hand, a height of the supported surface 184 lowers as the thickness of each printed board 30 increases. In addition, each printed board 30 may not have a constant thickness over its entire area, i.e., may have local portions having different thickness values. In the latter case, a plurality of support pins 150 may support those local portions, respectively. Moreover, in the case where one or more components 94 has or have already mounted on the reverse surface of the printed board 30, one or more support pins 150 may support the board 30 via the component or components 94. In the last case, a lower surface or respective surfaces of the component or components 94 provides or provide a portion or portions of the supported surface 184. In each case, the pin supporting table 152 supports, at respective positions pre-determined for each sort of printed boards 30, pre-determined sort or sorts of support pins 150, i.e., support pins 150 having respective lengths equal to respective distances between the pin-attachment surface 174 of the pin supporting table 152 being positioned at the upper end position, and the respective portions of the supported surface 184 where the printed board 30 being clamped by the printed-board clamping device is supported by the support pins 150. Therefore, a plurality of support pins 150 that cooperate with each other to support a single printed board 30 may be of a same sort having a same length, or of different sorts having different lengths.

In the present embodiment, when the current sort of printed boards 30 on which the components 94 are being mounted are changed to a different sort of printed boards 30, and accordingly the current board-convey width of the printed-board conveying device 12 is changed to a different board-convey width, i.e., is re-set, the printed-board supporting apparatus 14 is also re-set. More specifically described, first, the current set of support pins 150 that have been attached to the pin supporting table 152 to support the current sort of printed boards 30 are detached from the table 152, and are returned to the support-pin storing device 190. Then, a new set of support pins 150 that are to support a new sort of printed boards 30 are taken from the support-pin storing device 190, and are attached to the pin supporting table 152. These support-pin detaching and attaching operations are automatically carried out. Support-pin-attachment-position data representing positions where the support pins 150 are attached to the pin supporting table 152, and support-pin-storage-position data representing positions where the support pins 150 are stored in the support-pin storing device 190 are prepared for each sort of printed boards 30. According to those data, the pin holding unit 200 is moved by the X-Y robot 52 to carry out the support-pin detaching and attaching operations. Since, however, those operations are disclosed by, e.g., Japanese Patent Application Publication No. 2002-50899, no further description thereof is provided.

After all the support pins 150 are attached to the pin supporting table 152, according to the support-pin-attachment-position data corresponding to the new sort of printed boards 30, a horizontal-direction position of each of the support pins 150 in a horizontal direction perpendicular to an axis line of the each pin 150 and parallel to the pin-attachment surface 174, and a height of the support surface 166 of the each pin 150 are detected, and it is judged whether the detected height is appropriate.

Here, the manner in which the height of the support surface 166 of each support pin 150 is checked is briefly explained. In the present embodiment, this checking is carried out by taking, with the mark-image taking device 96, two images of the support surface 166 of each support pin 150, attached to the pin supporting table 152, at two image-take positions, respectively. One of the two image-take positions is a position (hereinafter, referred to as the first image-take position) where an image-take center as a center of an image-take surface of the mark-image taking device 96 is aligned with a center of the support surface 166; and the other image-take position is a position (hereinafter, referred to as the second image-take position) that is distant from the first image-take position by a pre-determined distance in a pre-determined direction parallel to the X-axis direction. Here, each of the first and second image-take positions is a nominal position on the assumption that the mark-image taking device 96 has no positional error and there is no positional error between the mark-image taking device 96 and each of the support pins 150 attached to the pin supporting table 152.

Based on the first image of the support surface 166 taken at the first image-take position, an error of the actual horizontal-direction position of each support pin 150 is obtained and, based on the second image of the support surface 166 taken at the second image-take position, an error of the actual height of the support surface 166 is obtained. Since the second image is taken at the second image-take position where the image-take center is offset from the center of the support surface 166 in the X-axis direction, the second image of the support surface 166 is formed, on the image-take surface of the mark-image taking device 96, at a position offset from the image-take center. That is, the position of the second image, i.e., a distance of the second image from the image-take center changes depending upon the actual height of the support surface 166. Therefore, a position of the center of the second image of the support surface 166 can be obtained and, based on the obtained position, a distance of the support surface 166 from the mark-image taking device 96 can be obtained. In the present embodiment, a height of the mark-image taking device 96 is used as a reference height, and a vertical-direction distance of the support surface 166 as a distance of the same 166 from the reference height in a vertical direction is detected. In addition, an error of the detected vertical-direction distance (i.e., detected height) of the support surface 166 from a nominal distance (i.e., nominal height) of the same 166 can be obtained. Then, whether the height of each support pin 150 attached to the pin supporting table 152 is appropriate is judged by judging whether the obtained error of the detected vertical-direction distance falls within a pre-determined permission range. If the height of each support pin 150 is judged as being inappropriate, a cause for the judgment is sought and solved.

Figure 6:
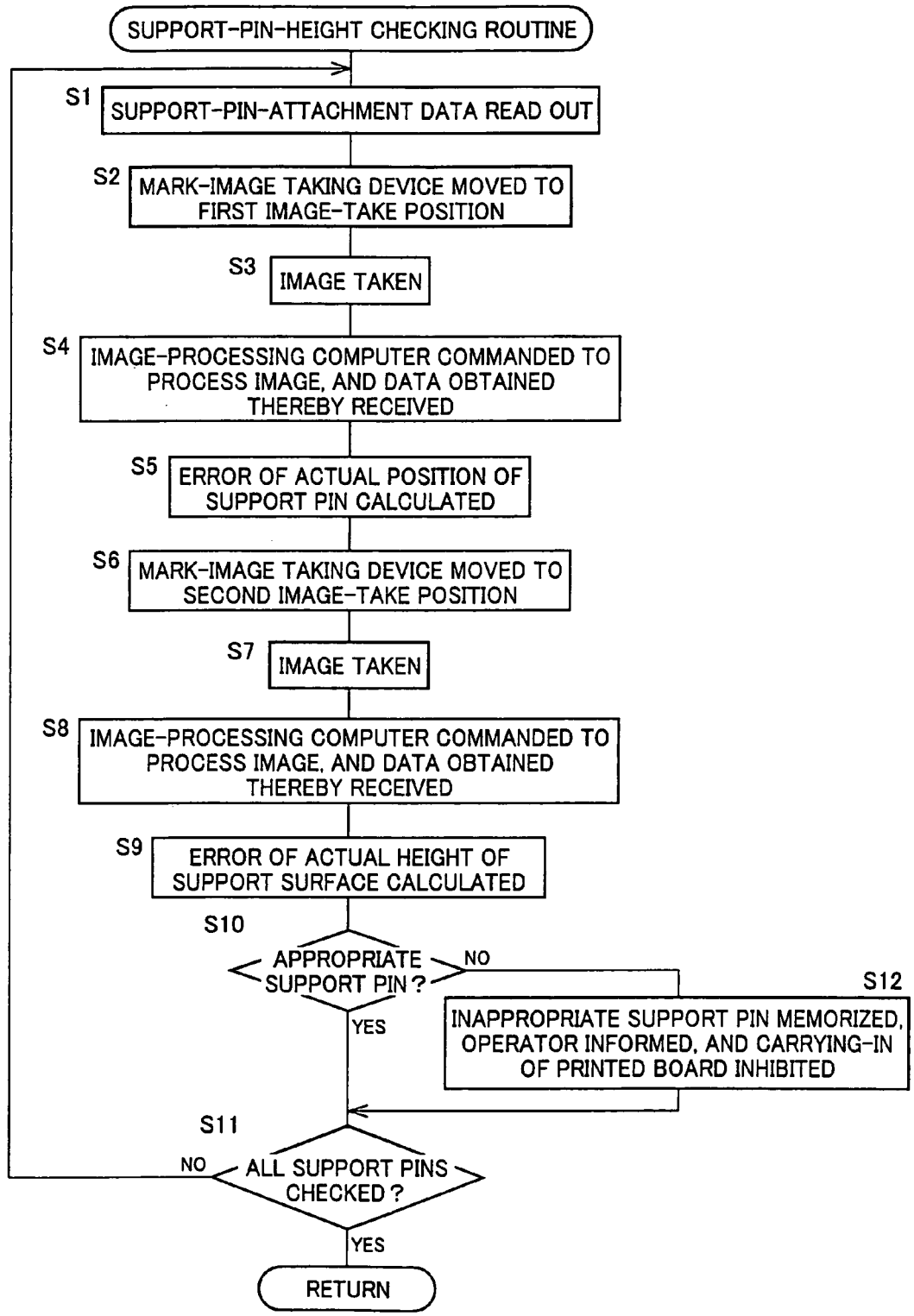
FIG. 6 is a flow chart representing a support-pin-height checking routine that is carried out by the control device.

FIG. 6 shows a support-pin-height checking routine that is carried out by the mounting-control computer 280 of the control device 24. First, at Step S1, the computer 280 reads out the support-pin-attachment-position data from the ROM 272. The support-pin-attachment-position data include the respective pre-determined sorts of the support pins 150 to be attached to the pin supporting table 152; the respective pre-determined positions where the support pins 150 are to be attached to the table 152; and the pre-determined order in which the support pins 150 are to be attached to the table 152. In the present embodiment, the position where each support pin 150 is to be attached to the pin supporting table 152 means the position with which the center of the support surface 166 of the each pin 150 is to be aligned. In the present electronic-circuit-component mounting system, the respective positions where the support pins 150 are to be attached to the pin supporting table 152 are pre-determined on the horizontal, X-Y coordinate plane. In the present embodiment, the respective heights of the support pins 150 are sequentially checked in the same order as the pre-determined order in which the support pins 150 are attached to the pin supporting table 152. At Step S1, the computer 280 reads out one pre-determined position where one support pin 150 (e.g., the initial support pin 150) is to be attached to the pin supporting table 152, according to the pre-determined order in which the support pins 150 are to be attached to the table 152. Then, at Step S2, the mark-image taking unit 22 is moved by the X-Y robot 52 according to the pre-determined position read out at Step S1. Thus, the mark-image taking device 96 is moved to the first image-take position corresponding to the one support pin 150.

Figure 8A:
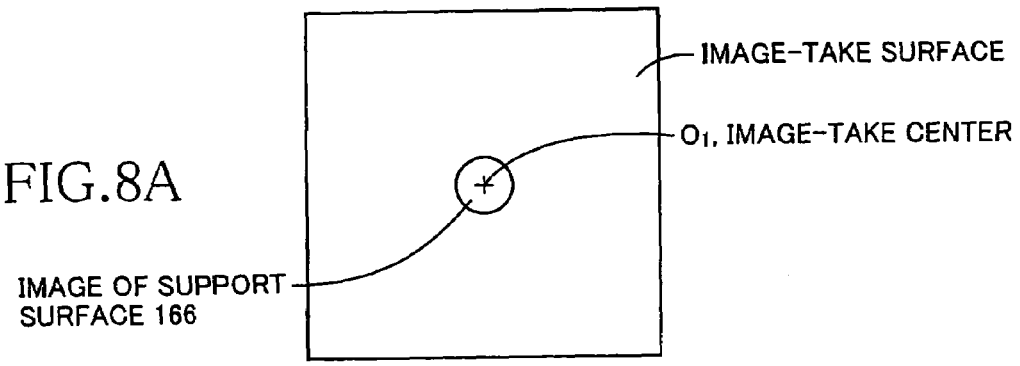
FIGS. 8A and 8B are views for explaining a manner in which an image of a support surface of one support pin is taken by the mark-image taking device at a first image-take position.
Figure 8B:
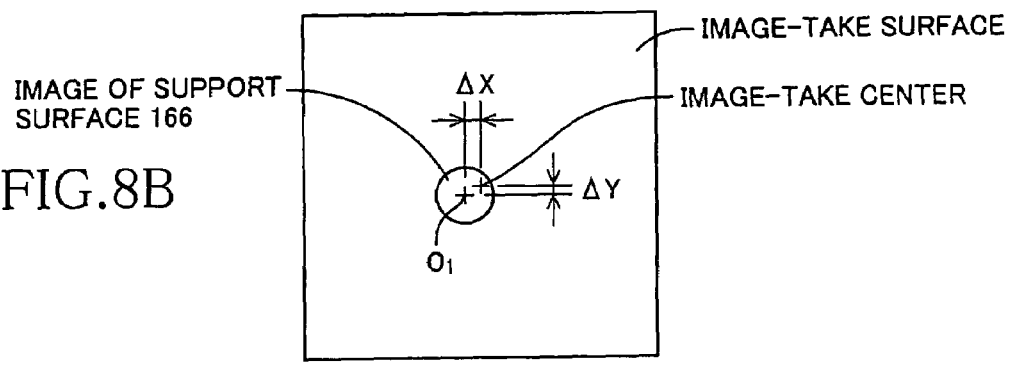

Then, at Step S3, the computer 280 commands the mark-image taking device 96 to take a first image of the support surface 166 of the one support pin 150. When the height of each support pin 150 is checked, the pin supporting table 152 is moved upward to, and positioned at, the upper end position, so that the support surface 166 of the each pin 150 is positioned at the same height as the height thereof when the each pin 150 supports the printed board 30. Subsequently, at Step S4, the computer 280 commands the image processing computer 288 to process the first image of the support surface 166 taken at Step S3 and obtain contour data representing a contour of the first image of the support surface 166. However, the image processing computer 288 may be adapted to calculate a position of the center of the first image of the support surface 166. The thus obtained contour data are sent to the mounting-control computer 280. At Step S5, the computer 280 calculates an error of an actual position of the one support pin 150. At the first image-take position, the first image of the support surface 166 is taken in a state in which the image-take center of the mark-image taking device 96 is expected to be aligned with the center of the support surface 166 of the one support pin 150. Therefore, if the actual position of the one support pin 150 has no error, then the first image of the support surface 166 is formed on the image-take surface of the taking device 96 such that the center of the first image of the support surface 166 coincides with the image-take center of the taking device 96, as illustrated in FIG. 8A. On the other hand, if the actual position of the one support pin 150 has some error, then the first image of the support surface 166 is formed on the image-take surface such that the center of the first image of the support surface 166 is distant by some distance from the image-take center, as illustrated in FIG. 8B. The computer 280 calculates, based on the contour data representing the contour of the first image of the support surface 166, a position of the center, $O_1$, of the contour and additionally calculates, if any, an error, $\Delta X$, of the center $O_1$ from the image-take center in the X-axis direction and an error, $\Delta Y$, of the center $O_1$ from the image-take center in the Y-axis direction. The thus calculated errors $\Delta X$, $\Delta Y$ are an error of the actual position of the one support pin 150 from a nominal position thereof.

In the case where the actual position of the one support pin 150 has some error, an actual position where the first image of the support surface 166 of the one pin 150 is formed on the image-take surface changes by an amount corresponding to an actual height of the support surface 166. Thus, the error of the actual attachment position of the one support pin 150 includes an error of the actual formation position of the first image of the support surface 166 that corresponds to the actual height of the support surface 166. However, since at the first image-take position the first image of the support surface 166 is taken in the state in which the image-take center is expected to be aligned with the center of the support surface 166, the error of the actual attachment position of the one support pin 150 should be sufficiently small, if any, and accordingly the error of the actual formation position of the first image of the support surface 166 that corresponds to the actual height of the same 166 should also be sufficiently small, if any. Therefore, the latter error is negligible. On the other hand, if the former error is considerably large, the latter error may be corrected and then another first image of the support surface 166 may be taken at the first image-take position so as to detect, once more, an error of the actual attachment position of the one support pin 150.

The error of the actual attachment position of the one support pin 150 may be used to judge whether the actual position is appropriate, i.e., whether the one pin 150 is attached to the pin supporting table 152 at an appropriate position in the horizontal, X-axis direction, or may be used to correct the actual position. In the present embodiment, the error of the actual attachment position of the one support pin 150 is additionally used to detect the actual height of the support surface 166 of the one pin 150 that is freed of the influences from the error. To this end, this error is stored in association with the one support pin 150 in the RAM 274. Since, however, a manner in which it is judged whether an actual attachment position of a support pin is appropriate, and a manner in which an error of the actual position is corrected are disclosed by, e.g., Japanese Patent Application Publication No. 11-195899, no further explanation thereof is provided.

Figure 8C:
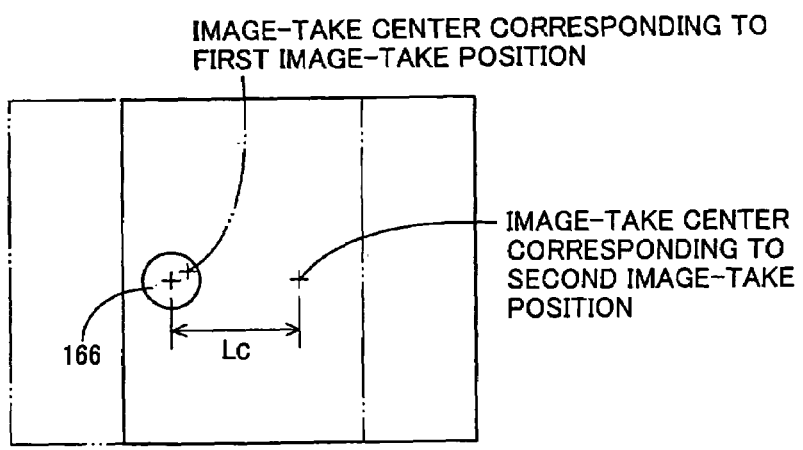
FIG. 8C is a view for explaining a manner in which another image of the support surface of the support pin is taken by the mark-image taking device at a second image-take position.

Then, at Step S6, the mark-image taking device 96 is moved to the second image-take position corresponding to the one support pin 150. To this end, the taking device 96 is moved by an adjusted amount reflecting the above-indicated error of the actual attachment position of the one support pin 150. More specifically described, as shown in FIG. 8C, the taking device 96 is moved by an amount assuring that the image-take center thereof is distant by a pre-determined distance, LC, from the actual position of the center of the support surface 166 of the one support pin 150. Owing to this adjusted movement, the mark-image taking device 96 can take, at the second image-take position, a second image of the support surface 166 in the same state as the state in which the one support pin 150 has no error in the horizontal, X-axis direction. Thus, an actual height of the support surface 166 of the one support pin 150 is detected in the state freed of the influences from the error of the actual attachment position of the one pin 150. The above-indicated distance LC is so pre-determined that even if a plurality of support pins 150 may have different heights because those pins 150 are of different sorts or are worn by different amounts, an entirety of the second image of the support surface 166 of each support pin 150 can be formed on the image-take surface. Then, at Step S7 that is identical with Step S3, the second image of the support surface 166 is taken and, at Step S8, the mounting-control computer 280 commands the image processing computer 288 to process the second image and send the obtained contour data to the former computer 280.

Figure 9A:
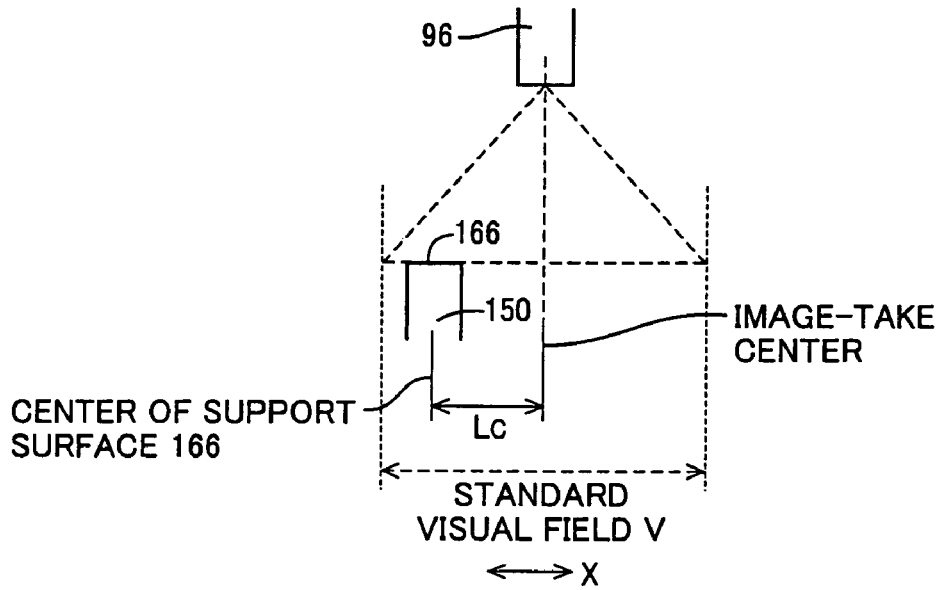
FIGS. 9A and 9B are views for explaining a manner in which an actual height of the support surface of the support pin is detected in the case where the actual height of the support surface is correct.
Figure 9B:
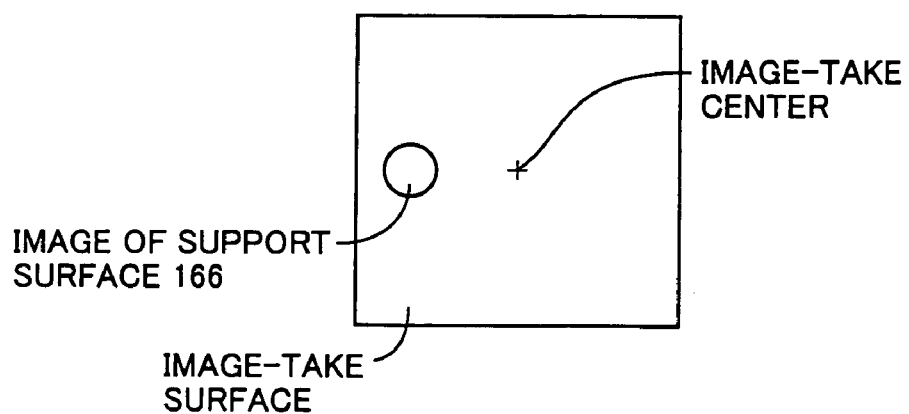
Figure 9C:
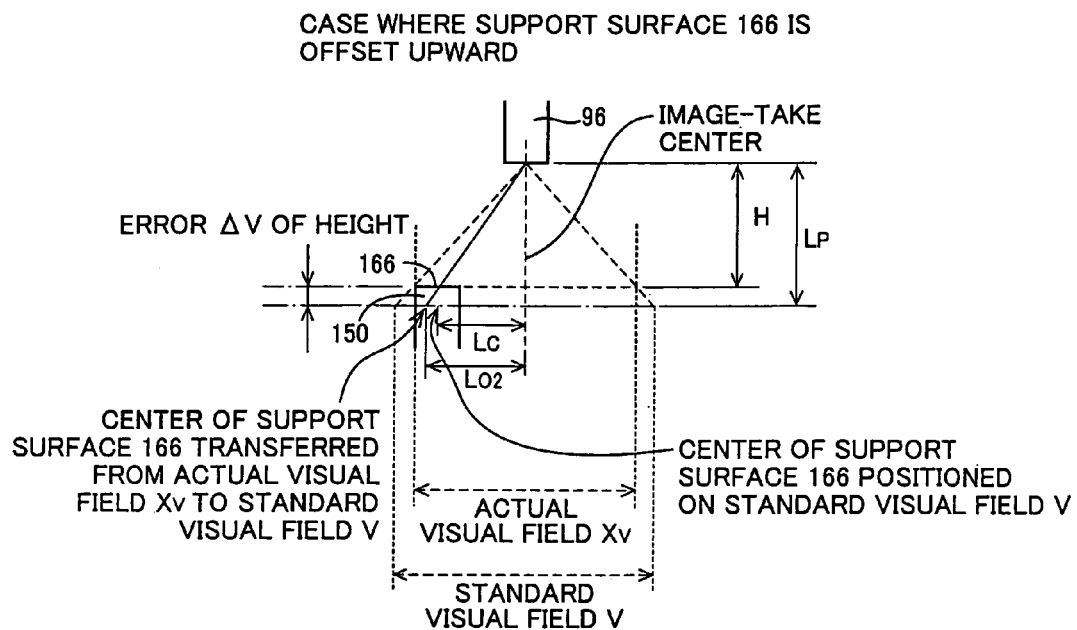
FIGS. 9C and 9D are views for explaining a manner in which an actual height of the support surface of the support pin is detected in the case where the actual height of the support surface is offset upward from a nominal height thereof.
Figure 9D:
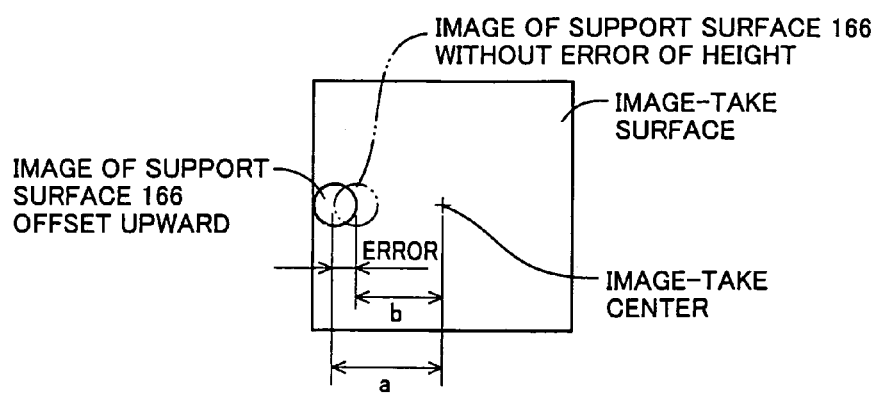

At the second image-take position, the second image of the support surface 166 is taken in the state, shown in FIG. 9A, in which the image-take center of the mark-image taking device 96 is distant by the pre-determined distance LC from the center of the support surface 166 in the X-axis direction. Therefore, the second image of the support surface 166 is formed on the image-take surface such that the second image is distant from the image-take center, as shown in FIG. 9B. The position where the second image of the support surface 166 is formed on the image-take surface changes depending upon the height of the support surface 166, such that a distance of the center of the second image of the support surface 166 from the image-take center increases as the height of the support surface 166 increases. The change of this distance is caused by at least one of (a) the incorrect-sort-caused error of the support surface 166 that is caused by the use of one or more support pins 150 of a different sort having a different length and (b) the wearing-caused error of the support surface 166 that is caused by, e.g., the wearing thereof. For example, in the case where the actual height of the support surface 166 is offset upward from a nominal height thereof, as shown in FIG. 9C, the second image of the support surface 166 is formed, as shown in FIG. 9D, on the image-take surface at a position more distant from the image-take center than a position where the second image would be formed if the actual height of the support surface 166 has no error. In the present embodiment, the distance between the center of the second image of the support surface 166 and the image-take center on the image-take surface is converted into a distance of the support surface 166 from the mark-image taking device 96 (i.e., a height of the support surface 166) and, whether the height of the one support pin 150 is appropriate is judged by judging whether an error of the thus obtained height of the support surface 166 from the nominal height thereof falls within a pre-determined permission range. In the present embodiment, the height of the support surface 166 is detected using the height of the mark-image taking device 96 as a reference height. The permission range is so pre-determined as to be able to detect considerably small errors such as the wearing-caused errors. Therefore, this permission range is considerably narrow. In the present embodiment, different permission ranges are pre-determined for different sorts of support pins 150, respectively, and are stored in the computer 280. The manner in which those permission ranges are determined will be described below.

In the present embodiment, the permission ranges are determined in the following manner: First, a plurality of sorts of standard pins that are accurately manufactured and that include a plurality of standard pins for each sort are attached to respective pre-determined positions on the pin supporting table 152 being positioned at the upper end position. Then, respective images of the respective support surfaces 166 of the plurality of standard pins for each sort are taken by the mark-image taking device 96. In this case, too, first and second images of the support surface 166 of each standard pin are taken at the first and second image-take positions, respectively. Therefore, at the second image-take position, the second image of the support surface 166 of each standard pin is taken in the state in which the actual position of each standard pin has no error. Thus, for each sort of standard pins, respective positions of respective centers of the respective support surfaces 166 of those standard pins are obtained from the respective second images of the respective support surfaces 166 taken at the respective second image-take positions. Since respective lengths of the standard pins are accurate, variations of the respective detected positions of the respective centers of the respective support surfaces 166 result from errors related to the image taking operations of the mark-image taking device 96. Respective distances between the respective centers of the respective support surfaces 166 and the image-take center are converted into respective heights of the respective support surfaces 166 relative to the mark-image taking device 96. Thus, for each sort of standard pins, variations of the respective heights of the respective support surfaces 166, resulting from the causes related to the electronic-circuit-component mounting system such as the mark-image taking device 96, are obtained.

The above-indicated conversion is carried out according to the following expression:

$$X_v = V \cdot (LC/LO2)$$

$$H = LP \cdot (X_v/V) = LP \cdot \{[V \cdot (LC/LO2)]/V\} = LP \cdot (LC/LO2)$$

where $X_v$ is an actual vision field of the mark-image taking device 96 (i.e., an actual length of the vision field in the X-axis direction) on the plane containing the support surface 166;

LC is a distance between the first and second image-take positions;

V is a standard vision field of the mark-image taking device 96 (i.e., a vision field of the mark-image taking device 96 on a standard plane, i.e., a plane distant by a standard distance, LP, from the mark-image taking device 96. In a particular case where the support surface 166 of each support pin 150 is present on the standard plane, the distance between the center of the second image of the support surface 166 and the image-take center is equal to the distance LC);

LO2 is a distance (indicated by in FIG. 9D), in the standard vision field, between the center of the second image of the support surface 166 and the image-take center in the X-axis direction; and H is a height of the support surface 166 relative to the mark-image taking device 96 (i.e., a distance of a plane on which the support surface 166 is present, from the taking device 96).

The height of the mark-image taking device 96 does not change. Therefore, if the height of the support surface 166 changes, then the position on the image-take surface where the second image of the support surface 166 is formed changes, such that as the height of the support surface increases, the distance between the center of the second image of the support surface 166 and the image-take center also increases so as to be greater than a distance (indicated by b in FIG. 9D) on the image-take surface that is equal to the distance LC. In fact, however, even if the height of the support surface 166 may change, the distance between the center of the support surface 166 and the image-take center does not change, as illustrated in FIG. 9C. The vision field of the mark-image taking device 96 is reduced, and accordingly the scaling factor (i.e., magnification) of the vision field is increases. Thus, the distance between the center of the support surface 166 and the image-take center is recognized as if it were increased. In the case where the support surface 166 is positioned below the standard plane, the vision field of the mark-image taking device 96 is enlarged, and accordingly the scaling factor (i.e., magnification) of the vision field is decreased. Thus, the distance between the center of the support surface 166 and the image-take center is recognized as if it were decreased. The second image of the support surface 166 formed on the image-take surface is processed on the assumption that the support surface 166 is present on the standard plane, irrespective of the actual height of the support surface 166, i.e., the height of a plane on which the support surface is actually present. Therefore, the actual distance LO2 corresponding to the distance between the center of the second image of the support surface 166 and the image-take center differs from the distance LC, and this difference is utilized to obtain, as an actual height of the support surface 166, a height of the plane on which the support surface 166 is actually present.

An error, ΔH, of the actual height of the support surface 166 is obtained according to the following expression:

$$\Delta H = LS - H$$

where LS is a nominal (i.e., designed) height of the support surface 166 relative to the mark-image taking device 96.

Each sort of support pins 150 has a specific nominal height LS. In the case where a certain sort of support pins has a standard length, a nominal height (distance) LS of the support surface 166 is equal to the standard distance LP. For each sort of standard pins, respective errors of the respective actual heights of the respective support surfaces 166 of those standard pins are obtained and, based on variations of those errors, and a range of errors that are permitted to occur to respective heights of the respective support surfaces 166 of the corresponding sort of support pins 150, a permission range used to check errors occurring to respective actual heights of the respective support surfaces 166 of the corresponding sort of support pins 150 is obtained. Like when the respective heights of respective support surfaces 166 of the standard pins are detected, when respective actual heights of the respective support surfaces 166 of the support pins 150 are detected, the detected actual heights are estimated to contain variations resulting from the errors related to the image taking operations of the mark-image taking device 96. Therefore, the permission range used to check the errors occurring to the respective actual heights of the respective support surfaces 166 is so pre-determined as to be able to judge assuredly, or substantially assuredly, whether the error of each one of those actual heights is permissible irrespective of the variation that may be included therein. For example, in the case where variations of respective errors of respective heights of the respective support surfaces 166 of a certain sort of standard pins, obtained based on the respective images thereof, are ±0.05 mm, and a range of errors that are permitted to occur to respective heights of the respective support surfaces 166 of the corresponding sort of support pins 150 is ±0.25 mm, a permission range used to check errors occurring to respective actual heights (or actual height positions) of the respective support surfaces 166 of the corresponding sort of support pins 150 may be ±0.20 mm. In this case, even if the error of each one of the actual heights may contain a variation resulting from an error related to an image taking operation of the mark-image taking device 96, it can be assuredly judged, using the permission range, whether the error of each one of the actual heights is permissible. This permission range is pre-determined for each sort of support pins 150, i.e., for each of the different heights of support surface 166, and is stored, in the ROM 272, in association with the each sort of support pins 150. In the present embodiment, those permission ranges are for detecting not only the wearing-caused errors that are caused by, e.g., the wearing of the support surfaces 166, but also the incorrect-sort-caused errors that are larger than the wearing-caused errors. In the present embodiment, the adjustment of the height of the support surface 166 of each support pin 150 is carried out, e.g., when the support surface 166 is worn to some extent. Therefore, an amount of adjustment of the height is considerably small. Therefore, it can be said that errors caused by inappropriate adjustments of the wearing-caused errors are also encompassed by the wearing-caused errors.

After the second image of the support surface 166 is taken at the second image-take position, the control goes to Step S9 to obtain a position of the center of the second image of the support surface 166 in the same manner as the manner in which the permission range used to check each height error is determined based on the images of the standard pins, and additionally obtain, based on the obtained position, an actual distance (i.e., an actual vertical-direction distance) of the support surface 166 from the mark-image taking device 96. Even in the case where the sort of the support pin 150 is correct but the height of the support surface 166 has an error, or even in the case where the sort of the support pin 150 is incorrect and accordingly the height of the support surface 166 has an error, an actual height of the support surface 166 is obtained, and an error of the obtained height from the nominal height is calculated. Then, at Step S10, it is judged whether the error obtained at Step S9 falls within the above-explained permission range. This permission range corresponds to the specific sort of the support pin 150, and is read out from the ROM 272 according to the sort of the same 150 that is represented by the support-pin-attachment-position data.

If the support surface 166 has an error but the error falls within the permission range, then a positive judgment is made at Step S10, and the control goes to Step S11 to judge whether the height-error checking has been carried out for all the support pins 150. If a negative judgment is made at Step S11, the control goes back to Step S1. On the other hand, if the height error of the support surface 166 goes beyond the permission range, then the height of the support pin 150 is inappropriate, and accordingly a negative judgment is made at Step S10. Thus, the control goes to Step S12 to store data related to the inappropriate support pin 150, in an inappropriate-support-pin-data memory provided in the RAM 274, and additionally control the display screen 304 to inform an operator of this fact. The data related to the inappropriate support pin 150 include, e.g., the sort of the support pin 150, the position where the pin 150 is to be attached to the pin supporting table 152, the height error of the pin 150, etc. In addition, the carrying-in of a new printed board 30 is inhibited. To this end, a carrying-in inhibiting flag that is provided in the RAM 274 is set to its ON state.

Figure 7:
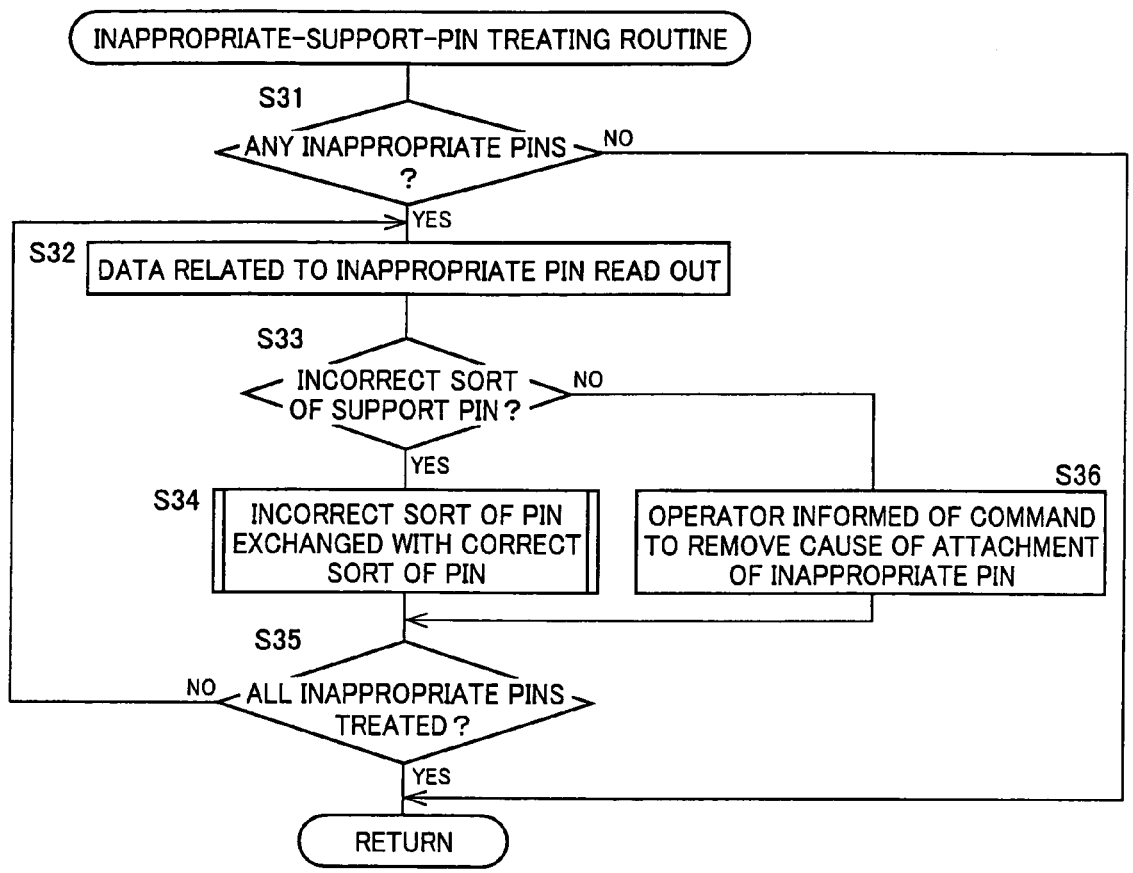
FIG. 7 is a flow chart representing an inappropriate-support-pin treating routine that is carried out by the control device.

After the height of support surface 166 has been detected, and checked, for all the support pins 150 attached to the pin supporting table 152, the control goes to an inappropriate-support-pin treating routine represented by a flow chart shown in FIG. 7. First, at Step S31, the mounting-control computer 280 judges whether there are any inappropriate support pins 150, by, e.g., judging whether there are any data stored in the inappropriate-support-pin-data memory provided in the RAM 274. If a negative judgment is made at Step S31, the control quits this routine.

On the other hand, if appositive judgment is made at Step S31, the control goes to Step S32 to read out the initial set of data related to the initial inappropriate support pin 150, from the inappropriate-support-pin-data memory. Then, at Step S33, the computer 280 judges whether the support pin 150 has been judged as being inappropriate because the sort of the pin 150 is incorrect. This judgment is made by, e.g., judging whether the amount of error of the detected actual height of the support surface 166 of the support pin 150 falls within a pre-determined range. This range is so pre-determined as to exclude the wearing-caused errors and detect only the incorrect-sort-caused errors, and is wider than the above-explained permission range used at Step S10. If the error amount does not fall within the pre-determined range, it can be judged that the height of the support pin 150 actually attached to the pin supporting table 152 is apparently higher, or smaller than, the height of the correct sort of support pin 150 and accordingly it can be estimated that the sort of the support pin 150 actually attached is incorrect. If a positive judgment is made at Step S33, the control goes to Step S34 to exchange automatically the incorrect sort of support pin 150 with a correct sort of support pin 150 stored by the support-pin storing device 190. More specifically described, the pin holding unit 200 is moved by the X-Y robot 52 to detach the incorrect sort of support pin 150 from the pin supporting table 152, return it to the support-pin storing device 190, take a correct sort of support pin 150 from the storing device 190, and attach the correct support pin 150 to the table 152. Step S34 is followed by Step S35 to judge whether all the inappropriate support pins 150 have been treated. If a negative judgment is made at Step S35, the control goes back to Step S32 to read out the next set of data related to the next inappropriate support pin 150 and goes to the following steps. However, Step S34 may be modified such that the computer 280 just stores, in the RAM 274, the set of data related to the inappropriate support pin 150 judged as being of an incorrect sort. In this case, after the respective sorts of all the inappropriate support pins 150 have been checked at Step S33, all the inappropriate support pin(s) 150 judged as of an incorrect sort are sequentially exchanged with respective correct sorts of support pins 150.

On the other hand, if a negative judgment is made at Step S33, the control goes to Step S36 to control the display screen 304 to display a command to remove a cause of attachment of the inappropriate support pin 150 and thereby inform an operator of the command. The display screen 304 displays, in addition to the command, the set of data related to the inappropriate support pin 150 and data representing the cause of attachment of the inappropriate support pin 150. In this case, the height error of the support surface 166 of the support pin 150 goes beyond the permission range and accordingly the pin 150 has been judged as being inappropriate. However, the sort of the support pin 150 has not been judged as being of an incorrect sort. Therefore, the cause of attachment of the inappropriate support pin 150 to be displayed by the screen 304 can be estimated to be wearing or the like. Based on the data displayed by the screen 304, the operator can carry out an appropriate treating operation such as adjustment of the height of the support pin 150 or removal of the foreign matter bitten by the support pin 150 attached to the pin supporting table 152. After the cause of attachment of the inappropriate support pin 150 has been removed, e.g., by exchanging the incorrect sort of support pin 150 with a correct sort of support pin 150 or adjusting the height of the inappropriate support pin 150, the carrying-in of a new printed board 30 is permitted. To this end, for example, the operator inputs, through the input device 294, data representing a carrying-in resuming command. Based on this command, the computer 280 re-sets the carrying-in inhibiting flag to its OFF state. Thus, a new printed board 30 is permitted to be carried into the present electronic-circuit-component mounting system. In addition, the inappropriate-support-pin data stored in the inappropriate-support-pin-data memory are cleared or deleted. However, the inappropriate-support-pin data may be transferred to another memory provided in the RAM 274, and may be used as, e.g., a portion of a history of each inappropriate support pin 150.

Thus, appropriate support pins 150 having respective appropriate heights are attached to respective appropriate positions on the pin supporting table 152. Therefore, those support pins 150 can support the printed board 30 without damaging the same 30. The manner in which the components 94 are mounted on the printed board 30 is well known in the art, and accordingly it is not described here. If the printed board 30 is not appropriately supported by the support pins 150, then the components 94 would not appropriately be mounted on the board 30. Since, however, this drawback can be avoided by the present mounting system, the mounting head 50 can appropriately carry out the component mounting operation.

As is apparent from the foregoing description of the present embodiment, the X-Y robot 52 and the support-pin elevating and lowering device 154 cooperate with each other to constitute a first relatively moving device; a portion of the control device 24 that carries out Steps S2, S3, S6, and S7 constitutes an image-taking control portion; a portion of the control device 24 that carries out Step S5 constitutes a perpendicular-direction-position detecting portion; a portion of the control device 24 that carries out Step S9 constitutes a height-direction-distance detecting portion as a height detecting portion, or a height-error detecting portion; the height detecting portion cooperates with the mark-image taking device 96 as a sort of height detecting head to constitute a height detecting device; a portion of the control device 24 that carries out Step S10 constitutes a judging portion; and the inappropriate-support-pin-data memory constitutes an inappropriate-support-pin-information storing portion as a sort of support-pin-information storing portion. In addition, the display screen 304 and a portion of the control device 24 that controls the screen 304 to display various data cooperate with each other to constitute a display device as a sort of informing device; a portion of the control device 24 that carries out Steps S12 and S36 constitutes an informing control portion; a portion of the control device 24 that carries out Step S12 constitutes a carrying-in-inhibiting control portion; and a portion of the control device 24 that carries out Step S34 constitutes a support-pin-exchanging control portion. Moreover, the X-Y robot 52 and the holding-head elevating and lowering device 204 cooperate with each other to constitute a second relatively moving device; and a portion of the control device 24 that controls, when the current set of support pins 150 is re-set, the second relatively moving device and the pin holding unit 200 to remove the support pins 150 from the pin supporting table 152, store the removed pins 150 in the pin storing device 190, take new support pins 150 from the storing device 190, and attach, as a new set of support pins 150, the taken pins 150 to the table 152, constitutes a support-pin-changing control portion. The X-Y robot 52 cooperates with the head elevating and lowering device 58 to constitute a third relatively moving device that moves at least one of the mounting head 50 as an operation performing head and an object (e.g., the printed board 30) on which an operation is performed by the head, relative to the other. Thus, in the present embodiment, the first and second relatively moving devices share the X-Y robot 52, and additionally share the same 52 with the component mounting device 16. Therefore, the printed-board supporting apparatus 14 or the electronic-circuit-component mounting system can be produced with a simplified construction and at a reduced cost. A portion of the control device 24 that controls the X-Y robot 52 and the mark-image taking device 96 to take the respective images of respective support surfaces of the standard pins and determine, based on the taken images, the permission range used to check the height of support surface 166 of each support pin 150, constitutes a height-error-permission-range obtaining portion. In addition, the pin holding unit 200 and the X-Y robot 52 cooperate with each other to constitute a support-pin attaching and detaching device. Thus, the re-setting of the printed-board supporting apparatus 14 can be automatically carried out easily and quickly, and the respective heights of respective support surfaces 166 of the new support pins 150 attached to the pin supporting table 152 as a result of the re-setting can be automatically checked easily and quickly. In addition, personal errors that would be possibly made when those operations are carried out by the operator can be effectively prevented.

When errors of height of support surface 166 that would result from causes related to the respective operations of the various devices (e.g., the mark-image taking device 96) of the electronic-circuit-component-mounting system are obtained using the standard pins, it is possible to use, as the standard pins, ones whose heights are adjustable. More specifically described, respective images of the respective support surfaces of those standard pins are taken as respective heights of those support surfaces are changed to each of different values, and this operation is repeated several times. Thus, several vertical-direction distances of the support surface of each standard pin are obtained for each of the different height values. Alternatively, the pin supporting table 152 may be provided with a height-adjustment jig that is used for changing the height of the support surface of each standard pin to each of different values.

Alternatively, the permission range may be determined using a plurality of sorts of standard pins that have different heights and that include a single support pin for each sort. In this case, each support pin is attached to the pin supporting table 152 and a single image of the support surface of the each pin is taken. This operation is repeated to detect a plurality of height values of the support surface of each sort of support pin. The thus detected height values are used to determine the above-explained permission range.

A set of support pins 150 may be commonly used to support different sorts of printed boards 30 having different thickness values. In this case, the support-pin elevating and lowering device 154 may include, as a drive source thereof, either an air-cylinder device 178 or a servo motor. In the case where the air-cylinder device 178 is used as the drive source, when the clamping members cooperate with the hold-down portions 134 to clamp each of the different sorts of printed boards 30 and then the upward movement of the pin supporting table 152 is stopped, the respective support surfaces 166 of the support pins 150 are positioned at respective heights corresponding to the thickness of the each sort of printed boards 30. In this case, when the errors of height of support surface 166 are obtained, the printed-board clamping device may be operated such that the clamping device clamps a spacer member in place of the each sort of printed boards 30 and then the standard pins are positioned at respective heights where the support pins 150 should support the each sort of printed boards 30. On the other hand, in the case where the servo motor is used as the drive source, when the errors of height of support surface 166 are obtained, the servo motor is driven to move the pin supporting table 152 upward to each of different upper end positions corresponding to the different thickness values of the different sorts of printed boards 30 and then the standard pins are positioned at respective heights where the support pins 150 should support the corresponding sort of printed boards 30.

In the case where a set of support pins 150 is commonly used to support different sorts of printed boards 30 having different thickness values, even if the support pins 150 used are of an incorrect sort and accordingly have an incorrect length, those support pins 150 cannot be judged as being inappropriate with respect to their length. In this case, therefore, Steps S33 and S34 are deleted from the inappropriate-support-pin treating routine. Alternatively, Step S12 of the support-pin-height checking routine may be so modified as to carry out a necessary inappropriate-support-pin treating operation.

The printed-board clamping device may be so modified as to clamp each of different sorts of printed boards 30 having different thickness values, such that the supported surface 184 of each sort of printed board 30 is positioned at a constant height. For example, the clamping members may be so modified as to press and clamp, on an upper side of each sort of printed board 30 that is opposite to a lower side thereof where the belt conveyor 110 is provided, opposite end portions of an upper surface (i.e., a component-mount surface) of the each sort of printed board 30, placed on the respective printed-board convey surfaces of the two conveyor belts 116 of the belt conveyor 110, against the upwardly facing, respective support surfaces 166 of the support pins 150. In this case, the respective component-mount surfaces of the different sorts of printed boards 30 are positioned at different heights corresponding to the different thickness values thereof. However, the supported surface 184 of each sort of printed board 30 is positioned at a constant height, except for the particular portion(s) where the board 30 is supported by the support pin(s) 150 via the component(s) 94 already mounted on the reverse surface or the irregularities present on the reverse surface. Thus, in this case, too, a set of support pins 150 can be commonly used to support different sorts of printed boards 30 having different thickness values.

The attaching, detaching, exchanging, and re-setting of the support pins 150 may be manually carried out by an operator, i.e., a working person.

Respective heights of respective support surfaces 166 of a plurality of support pins 150 that cooperate with each other to support a printed board 30 may be adjusted according to respective thickness values of respective supported portions of the printed board 30 that are to be supported by the support pins 150. In this case, as a result of the height adjustment, the support pins 150 may come to have different lengths and accordingly may be said as being of different sorts. In this case, those support pins 150 cannot be judged as being inappropriate because of their different sorts. If the height error of each support pin 150 goes beyond the pre-determined range wider than the permission range, it can be estimated that the height error of each support pin 150 would result from an error of adjustment of the height of the same 150. In this case, the operator can manually adjust the length of each support pin 150 and thereby adjust the height of the same 150 to an appropriate value.

In the illustrated embodiment, the distance between the center of the image of the support surface 166 and the image-take center of the mark-image taking device 96 on the image-take surface of the same 96 is converted to the distance of the support surface 166 from the taking device 96, i.e., the vertical-direction distance of the support surface 166. However, conversely, the nominal distance of the support surface 166 from the mark-image taking device 96, and the permission range may be converted to a distance and a permission range on the image-take surface so as to check the height error of the support surface 166. Those conversions may be done using the above-indicated expression used to obtain the height H.

If the first and second relatively moving devices share at least a portion thereof, then the printed-board supporting apparatus 14 as a whole can be produced with a simplified construction and at a reduced cost. However, the first and second relatively moving devices may be produced completely independent of each other.

The principle of the present invention is not limited to the printed-board supporting apparatus 14 for use with the present, X-Y-robot-type electronic-circuit-component mounting system in which the mounting head 50 is moved by the X-Y robot 52, but is applicable to a printed-board supporting apparatus for use with a head-revolution-type electronic-circuit-component mounting system in which one or more mounting heads are revolved around a common axis line, or other printed-board-related-operation performing systems than the electronic-circuit-component mounting systems; such as a screen printing system, an adhesive applying system, or a component-mounting inspecting system.

The invention claimed is:

1. A printed-board supporting apparatus comprising:
   at least one support pin having a support surface adapted to support a printed board;
   a pin supporting member which supports said at least one support pin; and
   a height detecting device which includes at least a height detecting head and detects a height of the support surface of said at least one support pin supported by the pin supporting member,
   wherein the height detecting head comprises an image taking device which has an image-take surface and which takes, in a direction facing the support surface of said at least one support pin, an image of the support surface of said at least one support pin, at a position where an image-take center as a center of the image-take surface is offset from a center of the support surface, and the height detecting device detects the height of the support surface, based on the image of the support surface taken by the image taking device.

2. The printed-board supporting apparatus according to claim 1, wherein the image taking device is adapted to take an image of at least one fiducial mark provided on the printed board.

3. The printed-board supporting apparatus according to claim 1, further comprising:
   a relatively moving device which moves at least one of (a) the image taking device and (b) said at least one support pin relative to an other of (a) the image taking device and (b) said at least one support pin, in at least a direction perpendicular to an axis line of said at least one support pin,
   wherein the height detecting device further includes:
   an image-taking control portion which controls the image taking device and the relatively moving device, such that the image taking device takes a first image of the support surface of said at least one support pin at a first image-take position where the image-take center is expected to be aligned with the center of the support surface, and takes a second image of the support surface of said at least one support pin at a second image-take position distant from the first image-take position by a predetermined distance in the direction perpendicular to the axis line of said at least one support pin;
   a perpendicular-direction-position detecting portion which detects, based on first image data representing the first image taken by the image taking device, a position of the center of the support surface of said at least one support pin in the direction perpendicular to the axis line thereof; and
   a height detecting portion which detects, based on the detected position of the center of the support surface of said at least one support pin in the direction perpendicular to the axis line thereof and second image data representing the second image taken by the image taking device, the height of the support surface of said at least one support pin.

4. The printed-board supporting apparatus according to claim 1, further comprising a relatively moving device which moves at least one of the image taking device and said at least one support pin relative to an other of the image taking device and said at least one support pin, in at least a direction perpendicular to an axis line of said at least one support pin, wherein the height detecting device further includes:
   a first image-taking control portion which controls the image taking device and the relatively moving device, such that the image taking device takes a first image of the support surface of said at least one support pin at a first image-take position where the image-take center is expected to be aligned with the center of the support surface;
   a perpendicular-direction-position detecting portion which detects, based on first image data representing the first image taken by the image taking device, a position of the center of the support surface of said at least one support pin in the direction perpendicular to the axis line thereof;
   a second image-taking control portion which controls, when the detected position of the center of the support surface of said at least one support pin has an error in the direction perpendicular to the axis line thereof the image taking device and the relatively moving device, such that the image taking device takes a second image of the support surface of said at least one support pin at a second image-take position that is distant, in the direction perpendicular to the axis line of said at least one support pin, from the first image-take position by a distance freed of influences from said error; and
   a height detecting portion which detects, based on second image data representing the second image taken by the image taking device, the height of the support surface of said at least one support pin.

5. The printed-board supporting apparatus according to claim 1, further comprising a relatively moving device which moves at least one of th image taking device and said at least one support pin relative to an other of th image taking device and said at least one support pin, in at least a direction perpendicular to an axis line of said at least one support pin, wherein the height detecting device further includes:
   an image-taking control portion which controls the image taking device and the relatively moving device, such that the image taking device takea an image of the support surface of said at least one support pin at an image-take position at an image-take center of the image taking device is distant from the center of the support surface of said at least one support pin by a predetimined distance in the direction perpendicular to the axis line thereof; and
   a height detectin gportion which detects, based on image data representing the image taken by the image taking device, the height of the support surface of said at least one support pin.

6. A printed-board supporting apparatus, comprising:
   at least one support pin having a support surface adapted to support a printed board;
   a pin supporting member which supports said at least one support pin;
   a height detecting device which includes at least a height detecting head and detects, in a state in which said at least one support pin does not support the printed board, a height of the support surface of said at least one support pin supported by the pin supporting member;
   a judging portion which judges, based on the height of the support surface detected by the height detecting device, whether said at least one support pin is appropriate;
   a treating portion which carries out a predetermined treating operation when the judging portion judges that said at least one support pin is not appropriate; and
   an informing device, wherein the treating portion comprises an informing control portion which controls, when the judging portion judges that the height of the support surface of said at least one support pin is not appropriate, the informing device to inform a person of a judgment that said at least one support pin is not appropriate.

7. The printed-board supporting apparatus according to claim 6, further comprising:

a relatively moving device which moves at least one of (a) the height detecting head and (b) said at least one support pin relative to an other of (a) the height detecting head and (b) said at least one support pin, in a direction perpendicular to an axis line of said at least one support pin.

8. A printed-board supporting apparatus, comprising:

at least one support pin having a support surface adapted to support a printed board;

a pin supporting member which supports said at least one support pin;

a height detecting device which includes at least a height detecting head and detects, in a state in which said at least one support pin does not support the printed board, a height of the support surface of said at least one support pin supported by the pin supporting member;

a support-pin storing device which stores a plurality of said support pins;

a support-pin holding device which holds, and releases, each of the support pins;

a relatively moving device which moves at least one of (a) the support-pin holding device and (b) a combination of the pin supporting member and the support-pin storing device relative to an other of (a) the support-pin holding device and (b) said combination; and a support-pin-changing control device which controls the support-pin holding device and the relatively moving device such that the support-pin holding device takes said each support pin from the support-pin storing device and mounts said each support pin on the pin supporting member, and takes said each support pin from the pin supporting member and stores said each support pin in the support-pin storing device.

9. The printed-board supporting apparatus according to claim 8, further comprising:

a judging portion which judges, based on the height of the support surface detected by the height detecting device, whether said each support pin mounted on the pin supporting member is appropriate; and a treating portion which carries out a predetermined treating operation when the judging portion judges that said each support pin is not appropriate, wherein the treating portion comprises a support-pin-exchanging control portion which controls the support-pin holding device and the relatively moving device such that the support-pin holding device exchanges said each support pin judged as being not appropriate, with an appropriate one of the support pins stored by the support-pin storing device.

* * * * *